(12) United States Patent
Tsutsui et al.

(10) Patent No.: US 9,385,660 B2
(45) Date of Patent: Jul. 5, 2016

(54) RADIO FREQUENCY AMPLIFYING CIRCUIT AND POWER AMPLIFYING MODULE

(71) Applicant: Murata Manufacturing Co., Ltd., Nagaokakyo-shi, Kyoto-fu (JP)

(72) Inventors: Takayuki Tsutsui, Nagaokakyo (JP); Satoshi Tanaka, Nagaokakyo (JP); Kenichi Shimamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 7 days.

(21) Appl. No.: 14/807,913

(22) Filed: Jul. 24, 2015

(65) Prior Publication Data

US 2015/0333702 A1 Nov. 19, 2015

Related U.S. Application Data

(63) Continuation of application No. 14/205,407, filed on Mar. 12, 2014.

(30) Foreign Application Priority Data

Mar. 19, 2013 (JP) ................................. 2013-057105
Nov. 18, 2013 (JP) ................................. 2013-238245

(51) Int. Cl.
| | | |
|---|---|---|
| H03F 3/04 | (2006.01) |
| H03F 1/02 | (2006.01) |
| H03F 1/30 | (2006.01) |
| H03F 3/19 | (2006.01) |
| H03F 3/21 | (2006.01) |
| H03F 1/32 | (2006.01) |
| H03F 1/56 | (2006.01) |
| H03F 3/189 | (2006.01) |
| H03F 3/24 | (2006.01) |

(52) U.S. Cl.
CPC .............. *H03F 1/0205* (2013.01); *H03F 1/302* (2013.01); *H03F 1/32* (2013.01); *H03F 1/56* (2013.01); *H03F 3/189* (2013.01); *H03F 3/19* (2013.01); *H03F 3/21* (2013.01); *H03F 3/245* (2013.01); *H03F 2200/108* (2013.01); *H03F 2200/129* (2013.01); *H03F 2200/222* (2013.01); *H03F 2200/318* (2013.01); *H03F 2200/387* (2013.01); *H03F 2200/411* (2013.01); *H03F 2200/451* (2013.01); *H03F 2200/555* (2013.01)

(58) Field of Classification Search
CPC ..... H03F 1/0227; H03F 3/195; H03F 1/0277; H03F 3/245; H03F 2200/27; H03F 2200/504; H03F 2200/451; H03F 2200/18; H03F 3/193; H03F 1/301; H03F 2200/78; H03F 3/189
USPC .......................... 330/285, 289, 296, 302, 311
See application file for complete search history.

(56) References Cited

U.S. PATENT DOCUMENTS 7,057,462 B2 * 6/2006 Kang et al. ..................... 330/285
7,365,604 B2 * 4/2008 Luo et al. ....................... 330/296

OTHER PUBLICATIONS

Tsuitsui et al., "Radio Frequency Amplifying Circuit and Power Amplifying Module", U.S. Appl. No. 14/205,407, filed Mar. 12, 2014.

*Primary Examiner* — Khanh V Nguyen
(74) *Attorney, Agent, or Firm* — Keating & Bennett, LLP

(57) ABSTRACT

An radio frequency amplifying circuit includes an amplifying transistor configured to amplify a radio frequency signal input to a base of the amplifying transistor via a matching network to output the amplified radio frequency signal, a first bias transistor connected to the amplifying transistor based on a current-mirror connection to supply a bias to the amplifying transistor, and a second bias transistor connected to the base of the amplifying transistor based on an emitter-follower connection to supply a bias to the amplifying transistor.

12 Claims, 30 Drawing Sheets

RADIO FREQUENCY AMPLIFYING CIRCUIT AND POWER AMPLIFYING MODULE

This application is based upon and claims the benefit of priority from Japanese patent application No. 2013-057105, filed on Mar. 19, 2013, and Japanese patent application No. 2013-238245, filed on Nov. 18, 2013, the disclosures of which are incorporated herein in its entirety by reference.

BACKGROUND OF THE INVENTION

1. Field of the Invention

The present invention relates to a radio frequency amplifying circuit and a power amplifying module including the radio frequency amplifying circuit.

2. Description of the Related Art

A mobile communication device such as a mobile phone uses a radio frequency (RF) amplifying circuit to amplify power of a radio frequency signal to be transmitted to a base station. Such an RF amplifying circuit includes an amplifying circuit that amplifies an RF signal and a bias circuit that biases a transistor of the amplifying circuit. See, for example, Japanese Patent Publication 11-330866, hereinafter referred to as JP-A-11-330866.

FIG. 16 is a diagram showing a common configuration of an amplifying circuit and a bias circuit described in JP-A-11-330866 as a conventional technique. An amplifying circuit 1601 amplifies an RF signal ($RF_{IN}$) input to a base of the amplifying circuit 1601 and outputs the amplified RF signal ($RF_{OUT}$). A bias circuit 1602 biases a transistor 1603 forming the amplifying circuit 1601 and has an emitter-follower configuration. In many cases, a battery voltage $V_{BAT}$ is applied to a collector of a transistor 1604 forming the bias circuit 1602.

In such a configuration, when the transistors 1603 and 1604 are, for example, heterojunction bipolar transistors (HBTs), a base-emitter voltage $V_{BE}$ of each transistor is around 1.3 V. Thus, the battery voltage $V_{BAT}$ needs to be about 2.8 V in order to drive the transistor 1604. Thus, the minimum value of the battery voltage $V_{BAT}$ is generally, for example, about 2.9 V.

In recent years, for mobile communication devices such as mobile phones, there has been a demand to reduce the minimum value of the battery voltage $V_{BAT}$ down to, for example, about 2.5 V in order to increase call time and communication time. However, in a configuration using the bias circuit 1602 of the emitter follower type as described above, the battery voltage $V_{BAT}$ needs to be about 2.8 V, precluding the above-described demand from being met.

SUMMARY OF THE INVENTION

In view of such circumstances, preferred embodiments of the present invention provide a radio frequency amplifying circuit that is driven at a low voltage.

A preferred embodiment of the present invention provides a radio frequency amplifying circuit including an amplifying transistor configured to amplify a radio frequency signal input to a base via a matching network to output the amplified radio frequency signal, a first bias transistor connected to the amplifying transistor on the basis of current-mirror connection to supply a bias to the amplifying transistor, and a second bias transistor connected to the base of the amplifying transistor on the basis of emitter-follower connection to supply a bias to the amplifying transistor.

Preferred embodiments of the present invention enable the radio frequency amplifying circuit to be driven at a low voltage for the reason described below.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
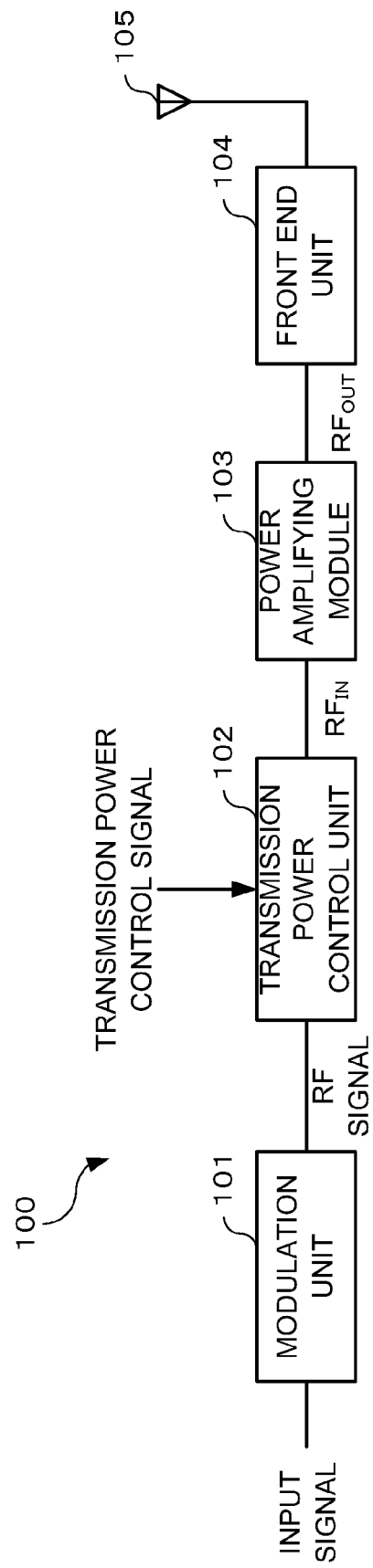
FIG. 1 is a diagram showing an example of a configuration of a transmission unit including a power amplifying module according to a preferred embodiment of the present invention.

Preferred embodiments of the present invention will be described below with reference to the drawings. FIG. 1 is a diagram showing an example of a configuration of a transmission unit including a power amplifying module according to a preferred embodiment of the present invention. A transmission unit 100 is preferably used in a mobile communication device such as a mobile phone to transmit various signals for voice, data, and the like to a base station. The mobile communication device also includes a reception unit configured to receive signals from the base station, which will not be described below.

As shown in FIG. 1, a transmission unit 100 includes a modulation unit 101, a transmission power control unit 102, a power amplifying module 103, a front end unit 104, and an antenna 105.

The modulation unit 101 modulates an input signal based on a modulation scheme such as High Speed Uplink Packet Access (HSUPA) or Long Term Evolution (LTE) to generate a radio frequency (RF) signal for wireless transmission. The RF signal is, for example, about several hundred MHz to several GHz in frequency.

The transmission power control unit 102 adjusts the power of the RF signal based on a transmission power control signal to output the adjusted RF signal. The transmission power control signal is generated, for example, based on an adaptive power control (APC) signal transmitted by the base station. For example, the base station measures a signal from the mobile communication device to transmit the APC signal to the mobile communication device as a command to adjust the transmission power of the mobile communication device to an appropriate level.

The power amplifying module 103 amplifies the power of the RF signal ($RF_{IN}$) output by the transmission power control unit 102 to a level required for the power transmission to the base station, such that the amplified signal ($RF_{OUT}$) is output.

The front end unit 104 carries out, for example, filtering of the amplified signal and switching to and from a reception signal received from the base station. The amplified signal output by the front end unit 104 is transmitted to the base station via the antenna 105.

Figure 2A:
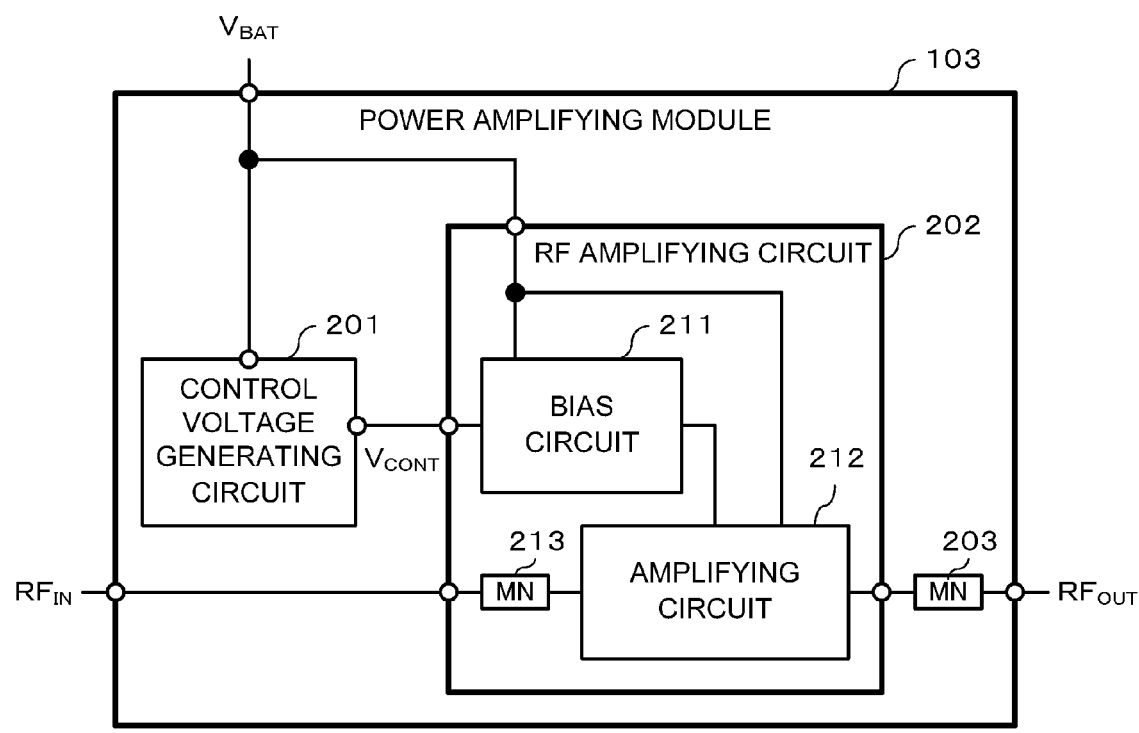
FIG. 2A is a diagram showing an example of a configuration of the power amplifying module according to a preferred embodiment of the present invention.

FIG. 2A is a diagram showing an example of a configuration of the power amplifying module 103. As shown in FIG. 2A, the power amplifying module 103 includes a control voltage generating circuit 201, an RF amplifying circuit 202, and a matching network (MN) 203. Furthermore, the RF amplifying circuit 202 includes a bias circuit 211, an amplifying circuit 212, and a matching network 213.

In the configuration shown in FIG. 2A, the control voltage generating circuit 201 and the RF amplifying circuit 202 are preferably provided on different substrates. For example, the control voltage generating circuit 201 preferably includes a MOS field-effect transistor (MOSFET). The RF amplifying circuit 202 can be configured using a bipolar transistor represented by a heterojunction bipolar transistor (HBT), for example. When the HBT is used for the RF amplifying circuit 202, a material for a substrate providing the HBT may be, for example, SiGe, GaAs, InP, or GaN. Alternatively, the control voltage generating circuit 201 and the RF amplifying circuit 202 may be provided on the same substrate.

The control voltage generating circuit 201 generates, from the battery voltage $V_{BAT}$, a control voltage $V_{CONT}$ supplied to the bias circuit 211.

The bias circuit 211 uses the control voltage $V_{CONT}$ supplied by the control voltage generating circuit 201 to bias a transistor of the amplifying circuit 212.

The amplifying circuit 212 amplifies the input RF signal ($RF_{IN}$) to output the amplified RF signal $RF_{OUT}$. Each of the matching networks 213 and 203, provided before and after the amplifying circuit 212, respectively, is adapted to match an input impedance with an output impedance. Each of the matching networks 213 and 203 preferably includes, for example, a capacitor or an inductor.

Figure 2B:
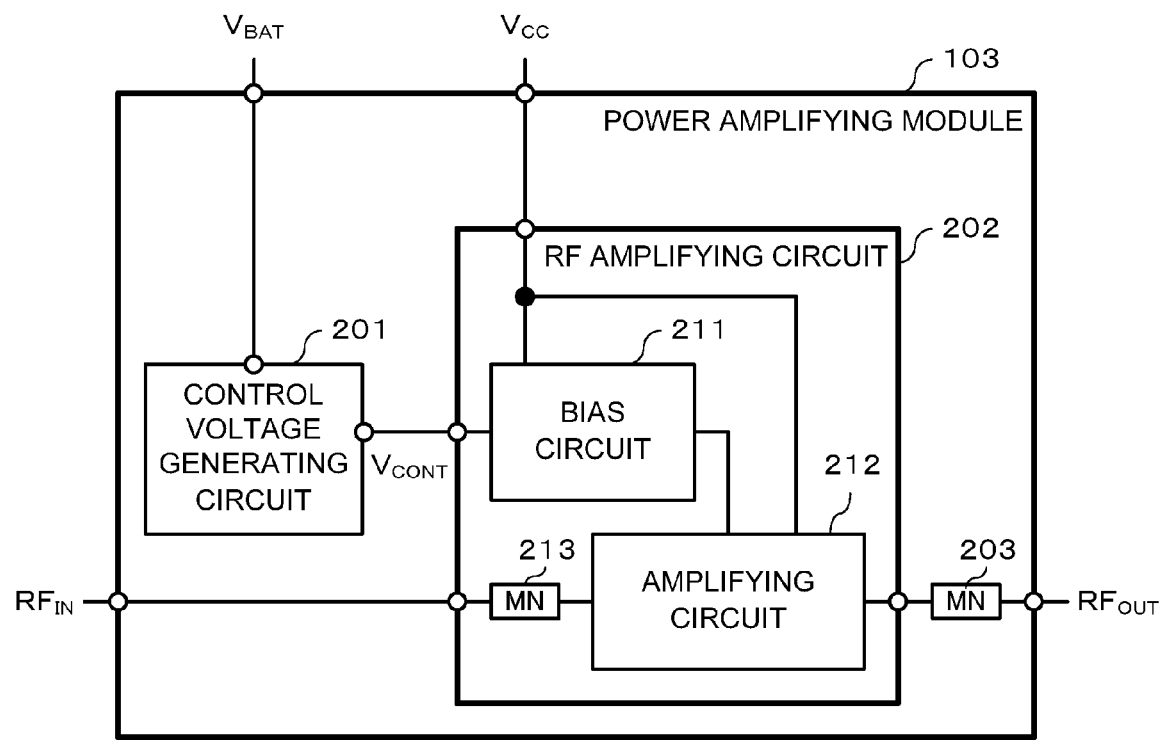
FIG. 2B is a diagram showing another example of a configuration of the power amplifying module according to a preferred embodiment of the present invention.
Figure 2C:
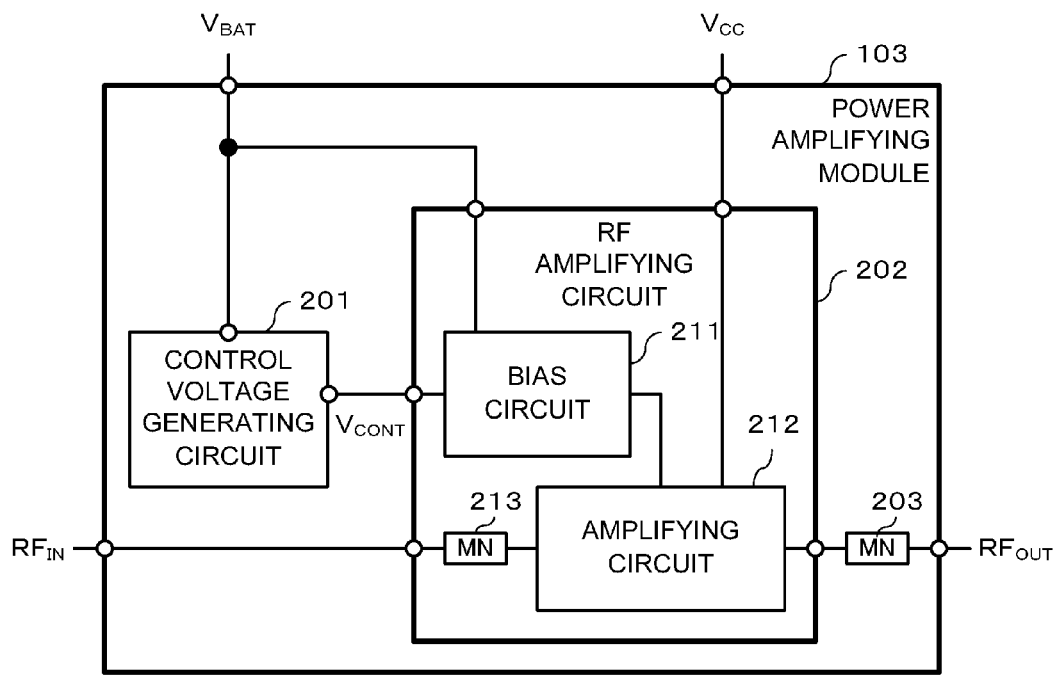
FIG. 2C is a diagram showing yet another example of a configuration of the power amplifying module according to a preferred embodiment of the present invention.

A power supply voltage supplied to the RF amplifying circuit 202 may be the battery voltage $V_{BAT}$ as shown in FIG. 2A. Furthermore, the power supply voltage supplied to the RF amplifying circuit 202 may be, for example, a voltage $V_{CC}$ of a predetermined level generated from the battery voltage $V_{BAT}$ via a DCDC converter, as shown in FIG. 2B. Moreover, as shown in FIG. 2C, the battery voltage $V_{BAT}$ may be a power supply voltage supplied to the bias circuit 211 and the voltage $V_{CC}$ may be a power supply voltage supplied to the amplifying circuit 212.

An example of a configuration of the control voltage generating circuit 201 and the RF amplifying circuit 202, which provide the power amplifying module 103, will be described.

Figure 3:
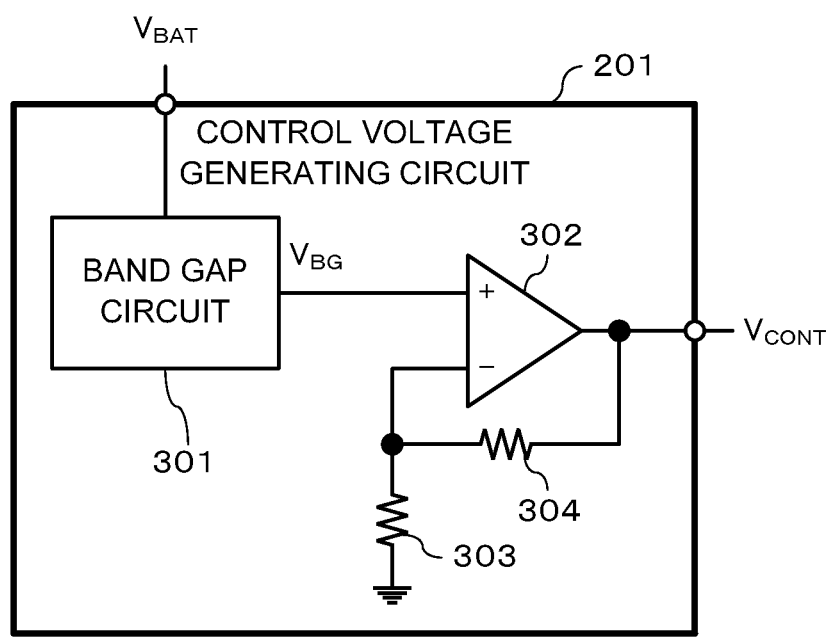
FIG. 3 is a diagram showing an example of a configuration of a control voltage generating circuit according to a preferred embodiment of the present invention.

FIG. 3 is a diagram showing an example of a configuration of the control voltage generating circuit 201. As shown in FIG. 3, the control voltage generating circuit 201 can be configured using a band gap circuit 301, an operational amplifier 302, and resistors 303 and 304.

The band gap circuit 301 generates, from the power supply voltage (in FIG. 3, the battery voltage $V_{BAT}$), a band gap reference voltage $V_{BG}$ that is independent of a variation in temperature or power supply voltage. A reference voltage $V_{BG}$ output by the band gap circuit is, for example, about 1.2 V.

The operational amplifier 302 and the resistors 303 and 304 provide a non-inverting amplifying circuit and amplify the reference voltage $V_{BG}$ using a gain that is dependent on the resistance value of the resistors 303 and 304 to generate a control voltage $V_{CONT}$. The control voltage $V_{CONT}$ may be, for example, about 2.35 V. A transistor providing the operational amplifier 302 may be, for example, a MOSFET. Alternatively, the transistor providing the operational amplifier 302 may be a bipolar transistor.

Furthermore, the control voltage generating circuit 201 may be configured to be able to adjust the control voltage $V_{CONT}$ in order to regulate the gain of the amplifying circuit 212. For example, the control voltage generating circuit 201 can adjust the control voltage $V_{CONT}$ by changing the resistance value of the resistor 303 or the resistor 304 depending on an externally input control signal.

Figure 4A:
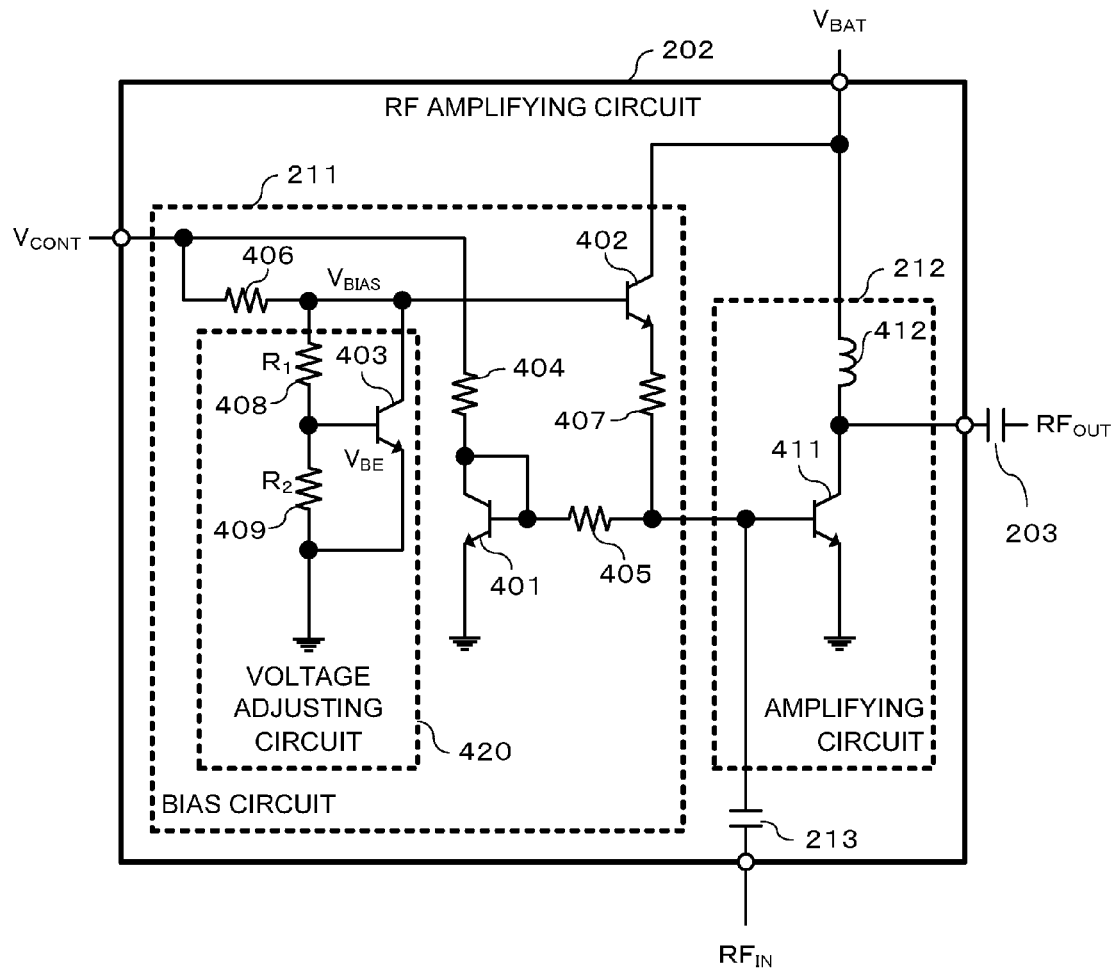
FIG. 4A is a diagram showing an example of a configuration of an RF amplifying circuit according to a preferred embodiment of the present invention.
Figure 4B:
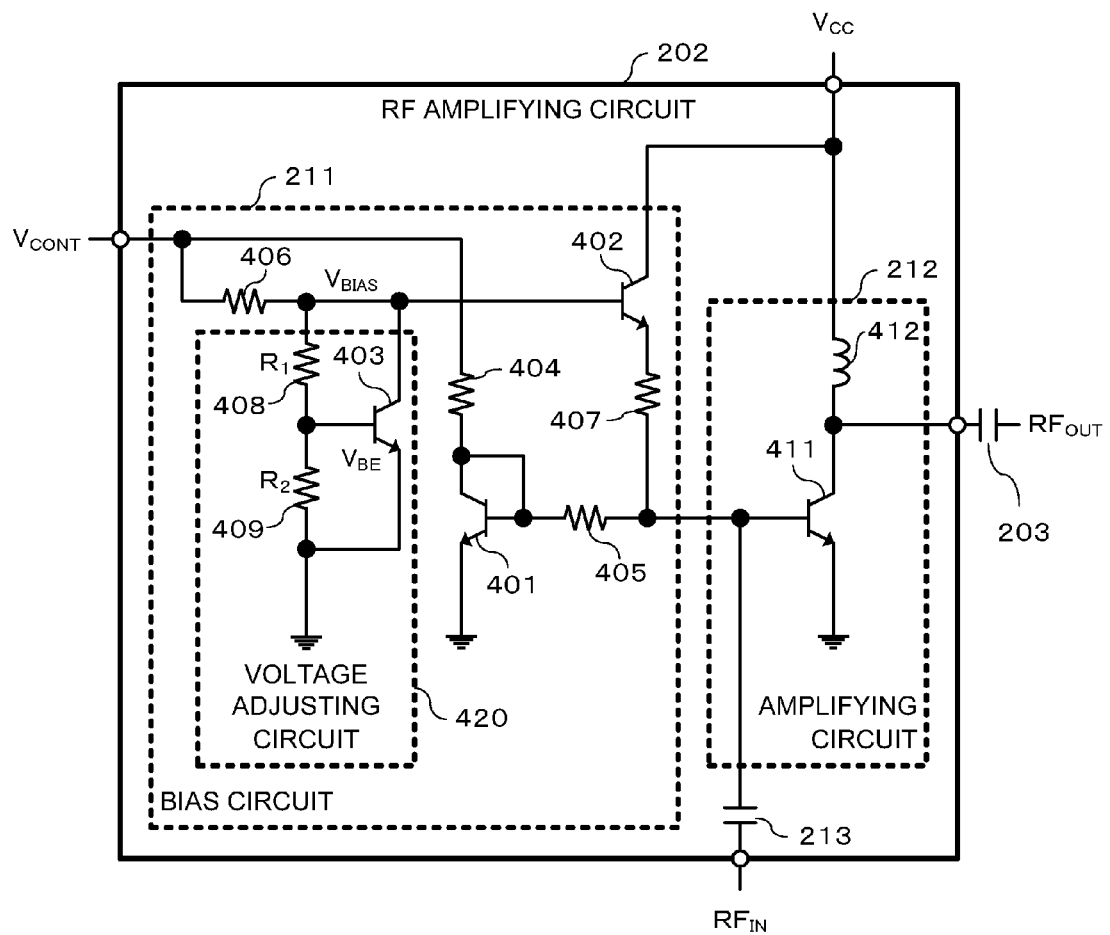
FIG. 4B is a diagram showing another example of a configuration of the RF amplifying circuit according to a preferred embodiment of the present invention.
Figure 4C:
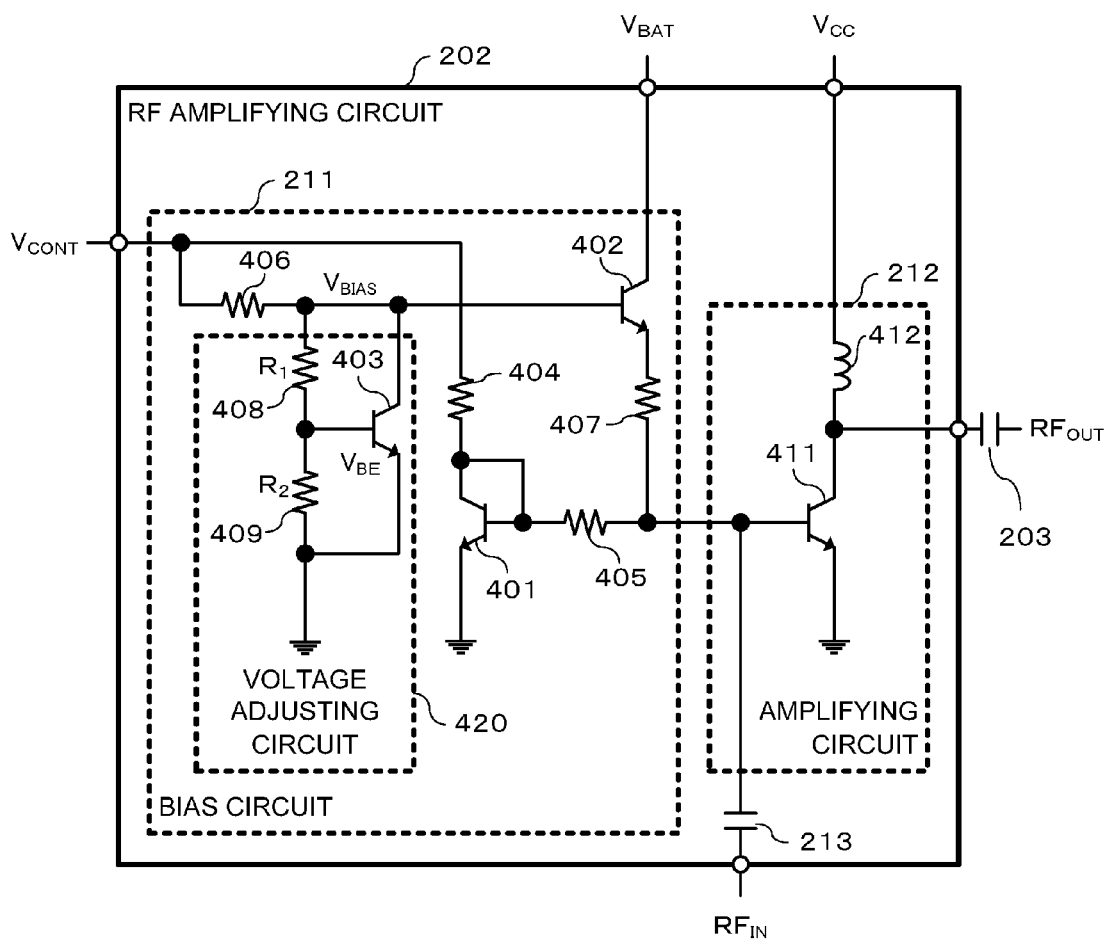
FIG. 4C is a diagram showing yet another example of a configuration of the RF amplifying circuit according to a preferred embodiment of the present invention.

FIG. 4A is a diagram showing an example of a configuration of the RF amplifying circuit 202 shown in FIG. 2A. Furthermore, FIG. 4B and FIG. 4C are diagrams showing examples of configurations of the RF amplifying circuit 202 shown in FIG. 2B and FIG. 2C. The configurations of the RF amplifying circuit 202 in FIG. 4A to FIG. 4C are equivalent except that different types of power supply voltages are supplied to the respective configurations. Thus, an example of a configuration of the RF amplifying circuit 202 will be described with reference to FIG. 4A. As described above, the RF amplifying circuit 202 includes the bias circuit 211, the amplifying circuit 212, and the matching network (capacitor) 213.

The bias circuit 211 can be configured to include transistors 401 to 403 and resistors 404 to 409. The transistors 401 to 403 are, for example, bipolar transistors such as HBTs. Such a configuration allows the bias circuit 211 to supply a bias to the amplifying circuit 212. The bias circuit 211 will be described below in detail.

The amplifying circuit 212 can be configured to include a transistor 411 (amplifying transistor) and an inductor 412. The transistor 411 is, for example, a bipolar transistor such as an HBT.

As shown in FIG. 4A, an RF signal ($RF_{IN}$) is input to a base of the transistor 411 via the matching network (capacitor) 213. A bias output of the bias circuit 211 is connected to the base of the transistor 411. Furthermore, the battery voltage $V_{BAT}$ is applied to one end of the inductor 412, and the other end of the inductor 412 is connected to a collector of the transistor 411. The amplified signal $RF_{OUT}$ is output from the collector of the transistor 411 via the matching network 203.

The bias circuit 211 will be described in detail. As shown in FIG. 4A, the transistor 401 (bias transistor) is diode-connected, and a base of the transistor 401 is connected to the base of the transistor 411 via the resistor 405. Furthermore, the control voltage $V_{CONT}$ is applied to a collector of the transistor 401 via the resistor 404. That is, the transistor 401 is connected to the transistor 411 on the basis of current-mirror connection. In other words, the transistors 401 and 411 provide a current mirror circuit. Consequently, a current flowing through the transistor 401 allows a current dependent on the size ratio of the transistors 401 and 411 to flow through the transistor 411.

As described above, the transistor 401 is configured to supply a bias to the transistor 411 connected to the transistor 401 on the basis of a current-mirror connection. In this case, the transistor 401 is grounded at an emitter thereof. Thus, even when the control voltage $V_{CONT}$ is equal to about a base-emitter voltage $V_{BE}$ of the transistor 401, a current is passed through the transistor 401.

However, the current flowing through the transistor 411 needs to be increased consistently with the signal level of the RF signal ($RF_{IN}$). However, it may be impossible that a large current is provided only by a bias from the current mirror circuit. Thus, for a bias supply in a case where the signal level of the RF signal ($RF_{IN}$) is higher than a predetermined level, the transistor 402 is provided which is connected to the transistor 411 on the basis of the emitter-follower connection.

As shown in FIG. 4A, the control voltage $V_{CONT}$ is applied to a base of the transistor 402 (bias transistor) via the resistor 406. Furthermore, the battery voltage $V_{BAT}$ is applied to a collector of the transistor 402. An emitter of the transistor 402 is connected to the base of the transistor 411 via the resistor 407. When the base-emitter voltage $V_{BE}$ of each of the transistors 411 and 402 is assumed to be about 1.3 V, a voltage $V_{BIAS}$ applied to the base of the transistor 402 needs to be higher than about 2.7 V in order to constantly drive the transistor 402, for example. Thus, if the control voltage $V_{CONT}$ is, for example, 2.35 V, the transistor 402 cannot constantly be driven.

As described above, the bias circuit 211 fails to constantly drive the transistor 402. However, in a region in which the RF signal ($RF_{IN}$) is at a high signal level, the transistor 402 is driven to supply a bias to the transistor 411. The principle by which the transistor 402 supplies a bias will be described below.

Figure 5:
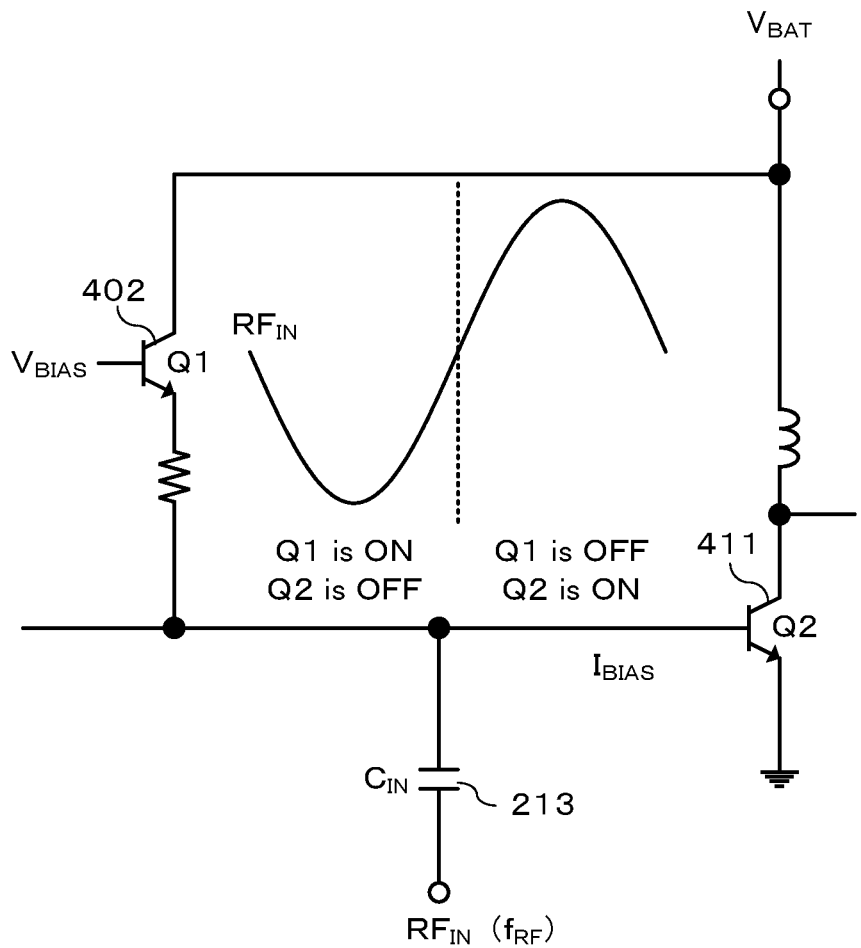
FIG. 5 is a diagram showing the principle of a bias supply.

FIG. 5 is a diagram illustrating the principle by which the transistor 402 supplies a bias to the transistor 411. As shown in FIG. 5, the voltage $V_{BIAS}$ is applied to the base of the transistor 402. If the control voltage $V_{CONT}$ supplied by the control voltage generating circuit is, for example, about 2.35 V, the voltage $V_{BIAS}$ is equal to or lower than about 2.35 V. Thus, with the base-emitter voltage $V_{BE}$ of each of the transistor 402 and the transistor 411 taken into account, the transistor 402 cannot constantly be kept on.

As shown in FIG. 5, the RF signal ($RF_{IN}$) is input to the base of the transistor 411 via the capacitor 213. Thus, in a region where the RF signal ($RF_{IN}$) is negative, the difference in potential between the base and emitter of the transistor 402 is significant. In a region where the signal level of the RF signal ($RF_{IN}$) is higher than the predetermined level, the potential difference is more significant than the base-emitter voltage $V_{BE}$ of the transistor 402, which is thus turned on. On the other hand, the transistor 411 is turned off in the region where the RF signal ($RF_{IN}$) is negative.

Furthermore, in a region where the RF signal ($RF_{IN}$) is positive, the difference in potential between the base and emitter of the transistor 402 decreases, thus turning the transistor 402 off. On the other hand, the transistor 411 is turned on in a region where the RF signal ($RF_{IN}$) is positive.

Figure 6:
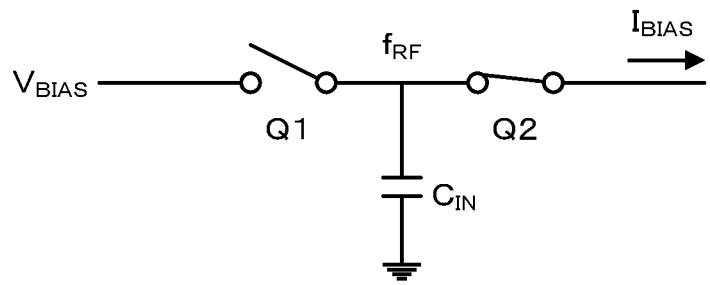
FIG. 6 is a diagram showing a configuration of a switched capacitor according to a preferred embodiment of the present invention.

The capacitor 213 is connected to the base of the transistor 411, and thus, in the region where the signal level of the RF signal ($RF_{IN}$) is higher than the predetermined level, the transistors 402 and 411 and the capacitor 213 can be considered to be equivalent to a switched capacitor in terms of a DC, as shown in FIG. 6.

When the frequency of the RF signal ($RF_{IN}$) is denoted by $f_{RF}$ and the capacitance of the capacitor 213 is denoted by $C_{IN}$, the resistance value of the switched capacitor shown in FIG. 6 is denoted by $1/(f_{RF} \cdot C_{IN})$. Thus, a DC bias current $I_{BIAS} = V_{BIAS} \cdot f_{RF} \cdot C_{IN}$ is supplied to the base of the transistor 411. Thus, in the region where the signal level of the RF signal ($RF_{IN}$) is higher than the predetermined level, the transistor 411 is supplied not only with a bias from the transistor 401 connected to the transistor 411 on the basis of the current-mirror connection but also with a bias from the transistor 402 connected to the transistor 411 on the basis of the emitter-follower connection. Such a configuration enables the transistor 411 to be supplied with a bias even when the control voltage $V_{CONT}$ is, for example, about 2.35 V. That is, the RF amplifying circuit 202 is configured to be driven at a low voltage.

With reference back to FIG. 4A, a voltage adjusting circuit 420 including the transistor 403 and the resistors 408 and 409 will be described. The transistor 403 is connected to the base of the transistor 402 at a collector of the transistor 403 and grounded at an emitter of the transistor 403. The resistor 408 is connected between the base and collector of the transistor 403. The resistor 409 is connected between the base and emitter of the transistor 403. When the base-emitter voltage of the transistor 403 is denoted by $V_{BE}$ and the resistance values of the resistors 408 and 409 are denoted by $R_1$ and $R_2$, the voltage of the collector of the transistor 403, that is, the voltage $V_{BIAS}$ applied to the base of the transistor 402, is equal to $V_{BE}(1+(R_1/R_2))$. Thus, the voltage $V_{BIAS}$ applied to the base of the transistor 402 can be set to a predetermined level that is dependent on the resistance values of the resistors 408 and 409. Furthermore, in connection with the base-emitter voltage $V_{BE}$, the transistor 403 has a temperature property equivalent to the temperature property of the transistor 402. Consequently, the voltage $V_{BIAS}$ can be adjusted according to the temperature property of the transistor 402. Additionally, a possible variation in diode potential caused by a process is compensated for. This allows the bias supplied to the transistor 411 by the transistor 402 to be restrained from being changed by temperature, improving the linearity of the RF amplifying circuit 202.

Figure 7A:
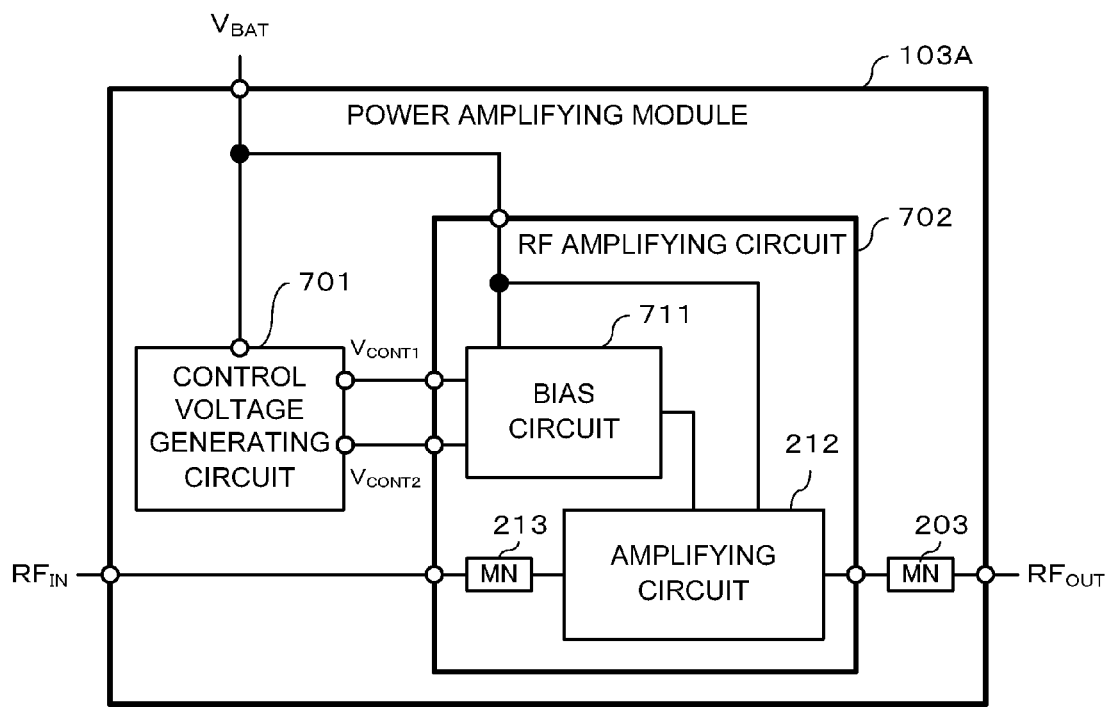
FIG. 7A is a diagram showing still another example of a configuration of the power amplifying module according to a preferred embodiment of the present invention.
Figure 7B:
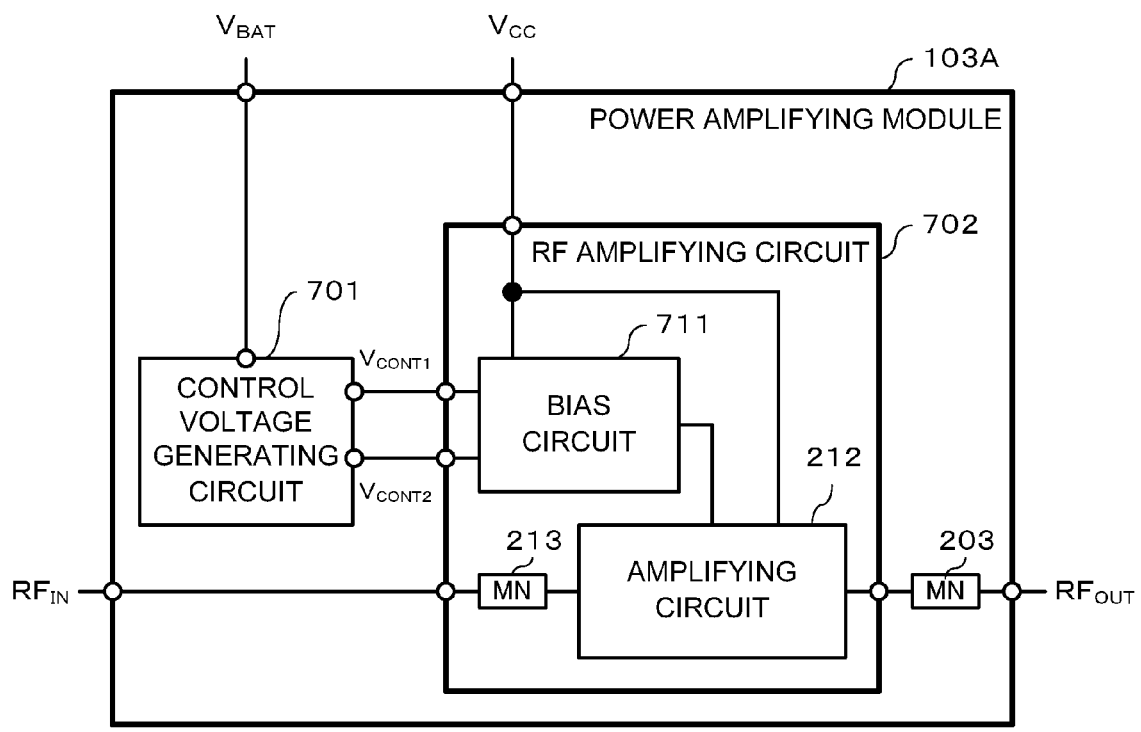
FIG. 7B is a diagram showing further another example of a configuration of the power amplifying module according to a preferred embodiment of the present invention.
Figure 7C:
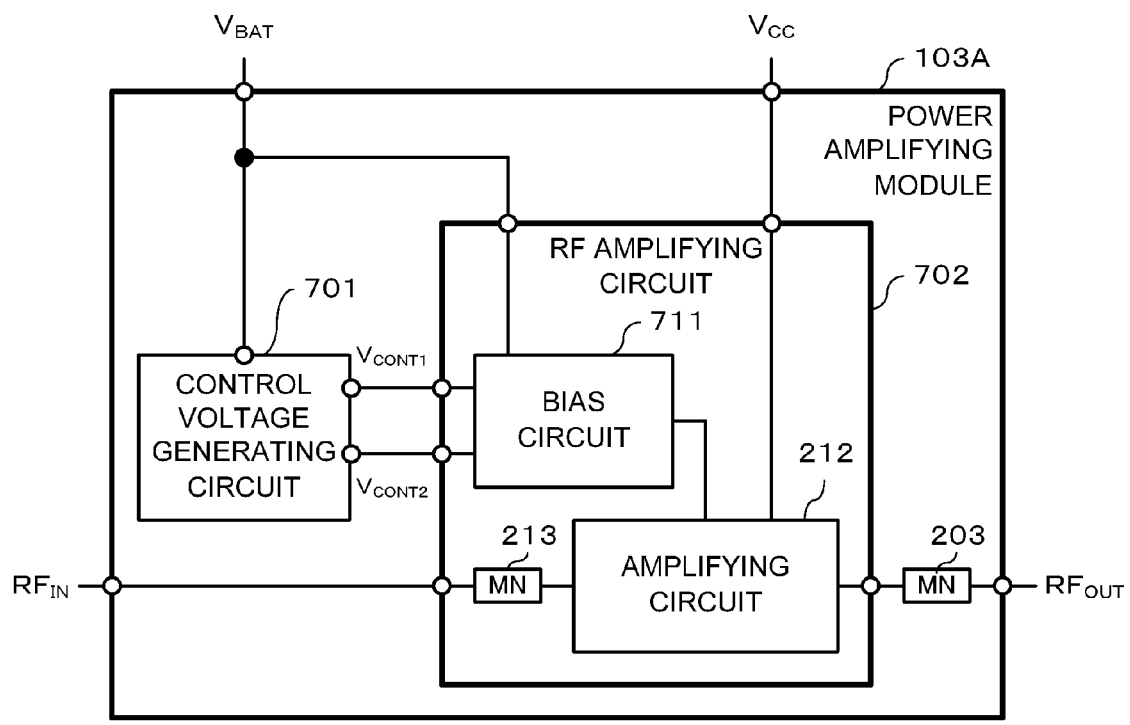
FIG. 7C is a diagram showing further another example of a configuration of the power amplifying module according to a preferred embodiment of the present invention.

FIG. 7A to FIG. 7C are diagrams showing other examples of configurations of the power amplifying module 103. The configurations of the power amplifying module 103 in FIG. 7A to FIG. 7C are equivalent except that different types of power supply voltages are supplied to an RF amplifying circuit 702. With reference to FIG. 7A, an example of a configuration of the power amplifying module 103 will be described. Components of the power amplifying module in FIG. 7A which are equivalent to corresponding components shown in FIG. 2A are denoted by the same reference numerals and will not be described below. As shown in FIG. 7A, a power amplifying module 103A includes a control voltage generating circuit 701 and RF amplifying circuit 702 instead of the control voltage generating circuit 201 and RF amplifying circuit 202 shown in FIG. 2A. The control voltage generating circuit 701 generates and supplies two control voltages $V_{CONT1}$ and $V_{CONT2}$ to a bias circuit 711. The bias circuit 711 biases the transistor providing the amplifying circuit 212 based on the control voltages $V_{CONT1}$ and $V_{CONT2}$.

Figure 8:
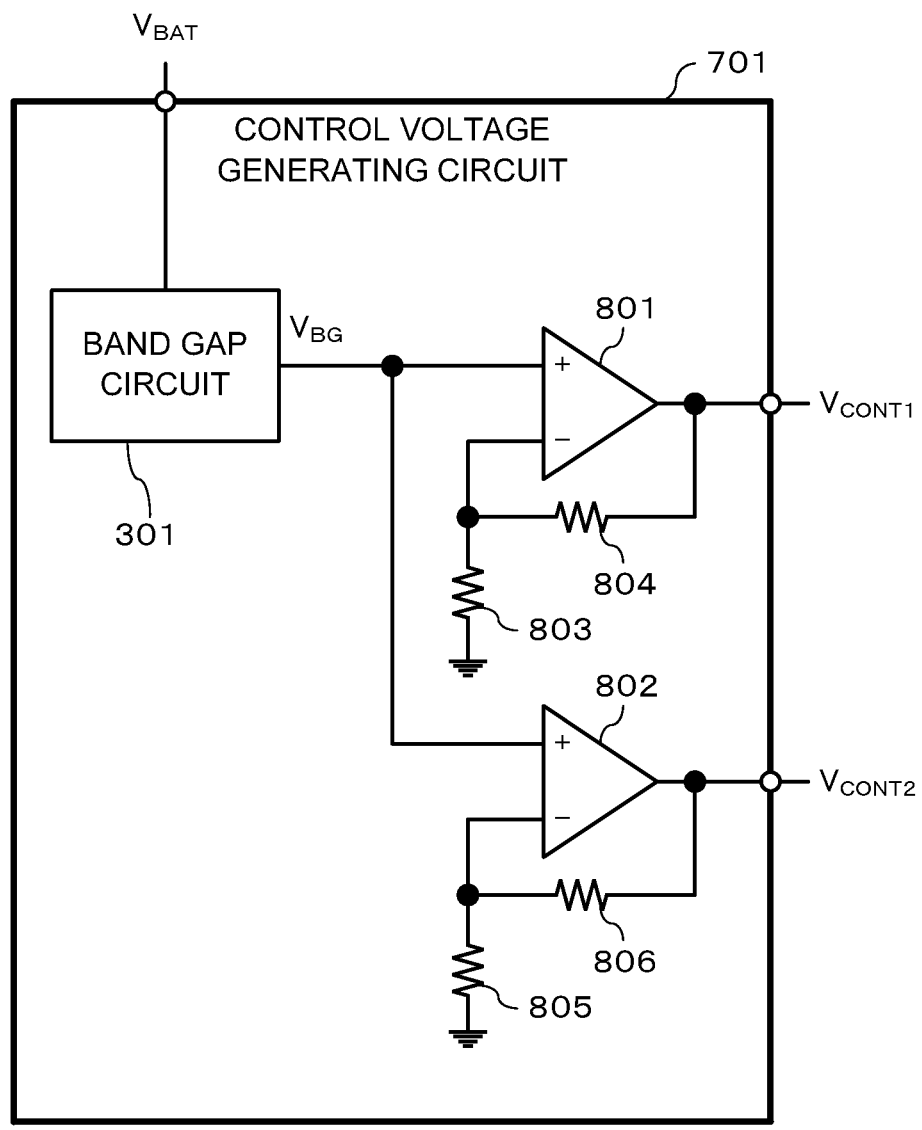
FIG. 8 is a diagram showing another example of a configuration of the control voltage generating circuit according to a preferred embodiment of the present invention.

FIG. 8 is a diagram showing an example of a configuration of the control voltage generating circuit 701. As shown in FIG. 8, the control voltage generating circuit 701 includes a band gap circuit 301, operational amplifiers 801 and 802, and resistors 803 to 806. The band gap circuit 301 is equivalent to the band gap circuit 301 shown in FIG. 3.

In the configuration shown in FIG. 8, the operational amplifier 801 and the resistors 803 and 804 provide a voltage generating circuit that generates a control voltage $V_{CONT1}$. Furthermore, the operational amplifier 802 and the resistors 805 and 806 provide a voltage generating circuit that generates a control voltage $V_{CONT2}$. An operation of generating the control voltages $V_{CONT1}$ and $V_{CONT2}$ is equivalent to the corresponding operation in the control voltage generating circuit 201 shown in FIG. 3 and will thus not be described below.

Figure 9A:
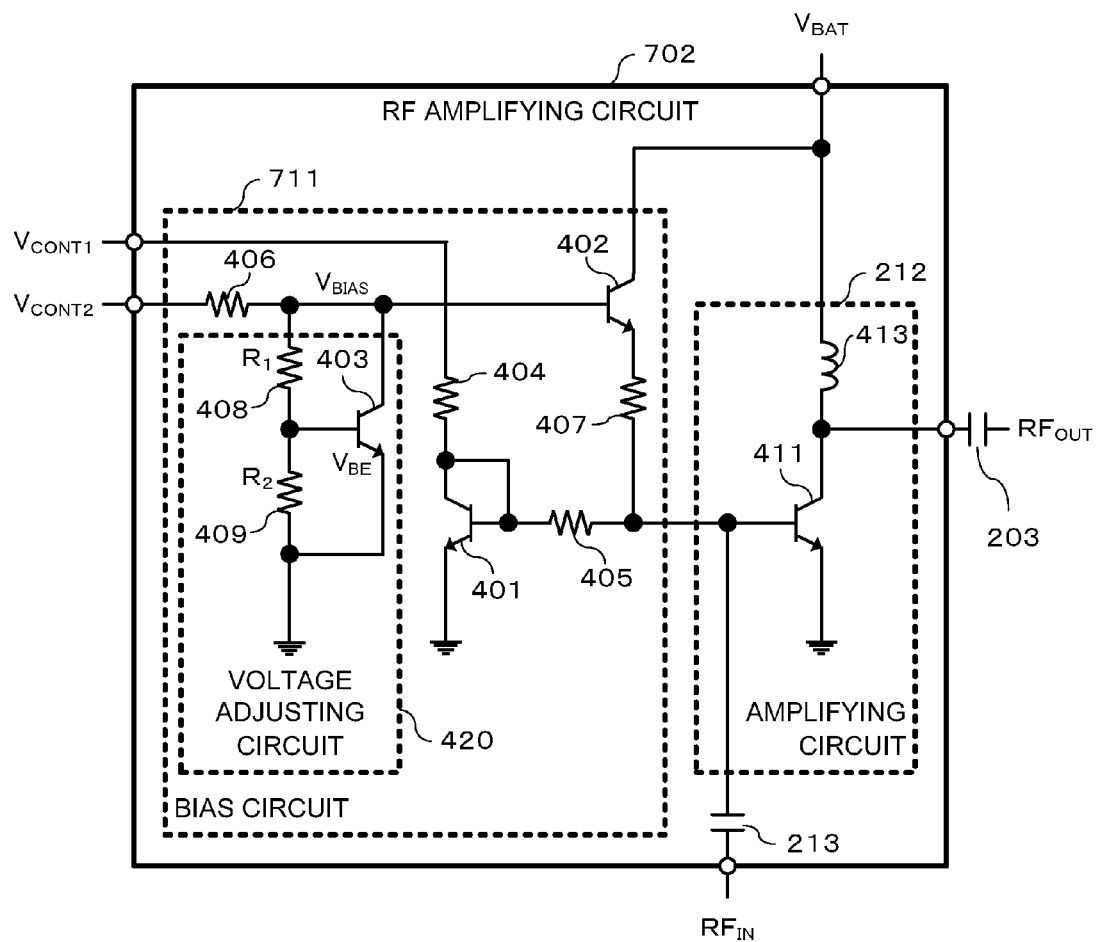
FIG. 9A is a diagram showing still another example of a configuration of the RF amplifying circuit according to a preferred embodiment of the present invention.
Figure 9B:
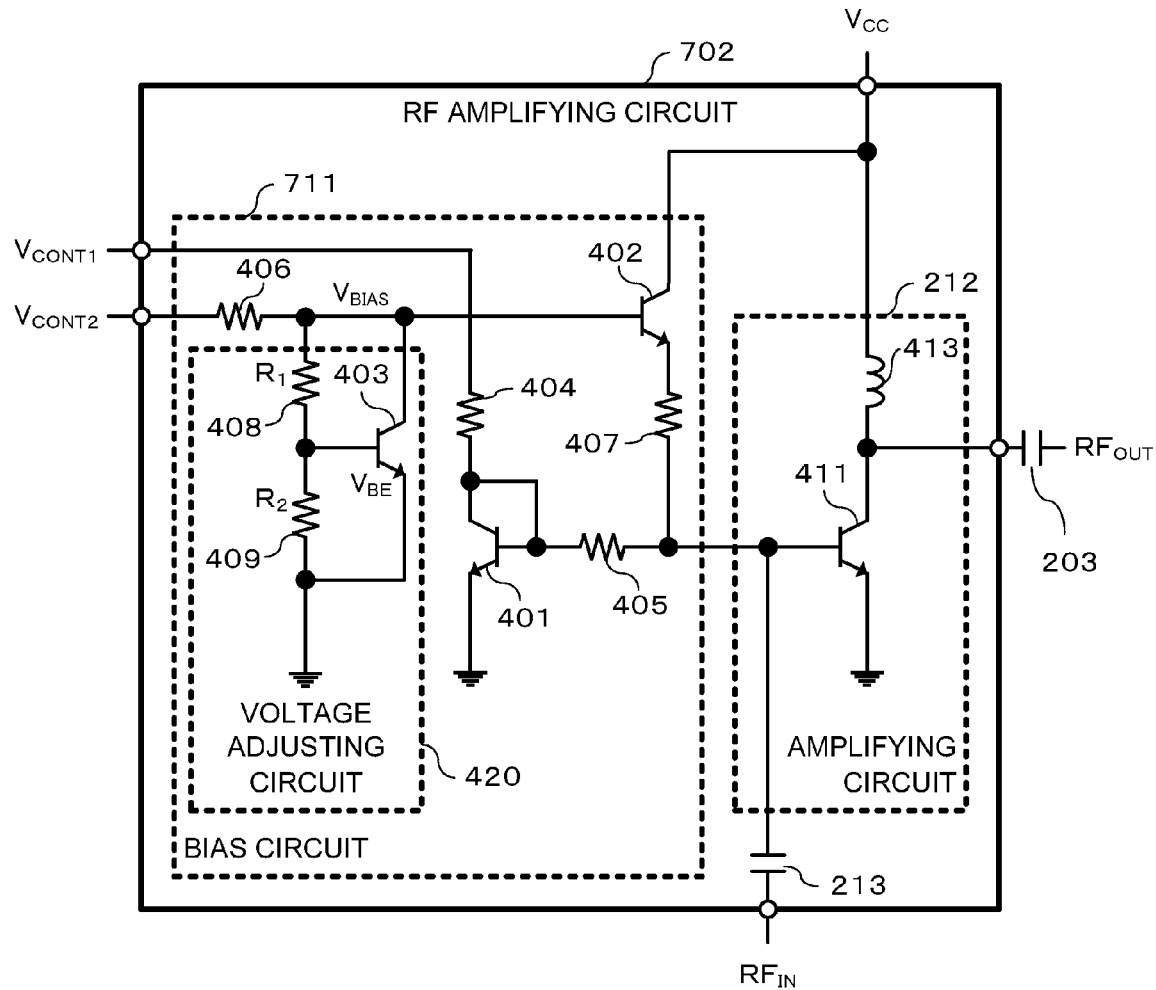
FIG. 9B is a diagram showing further another example of a configuration of the RF amplifying circuit according to a preferred embodiment of the present invention.
Figure 9C:
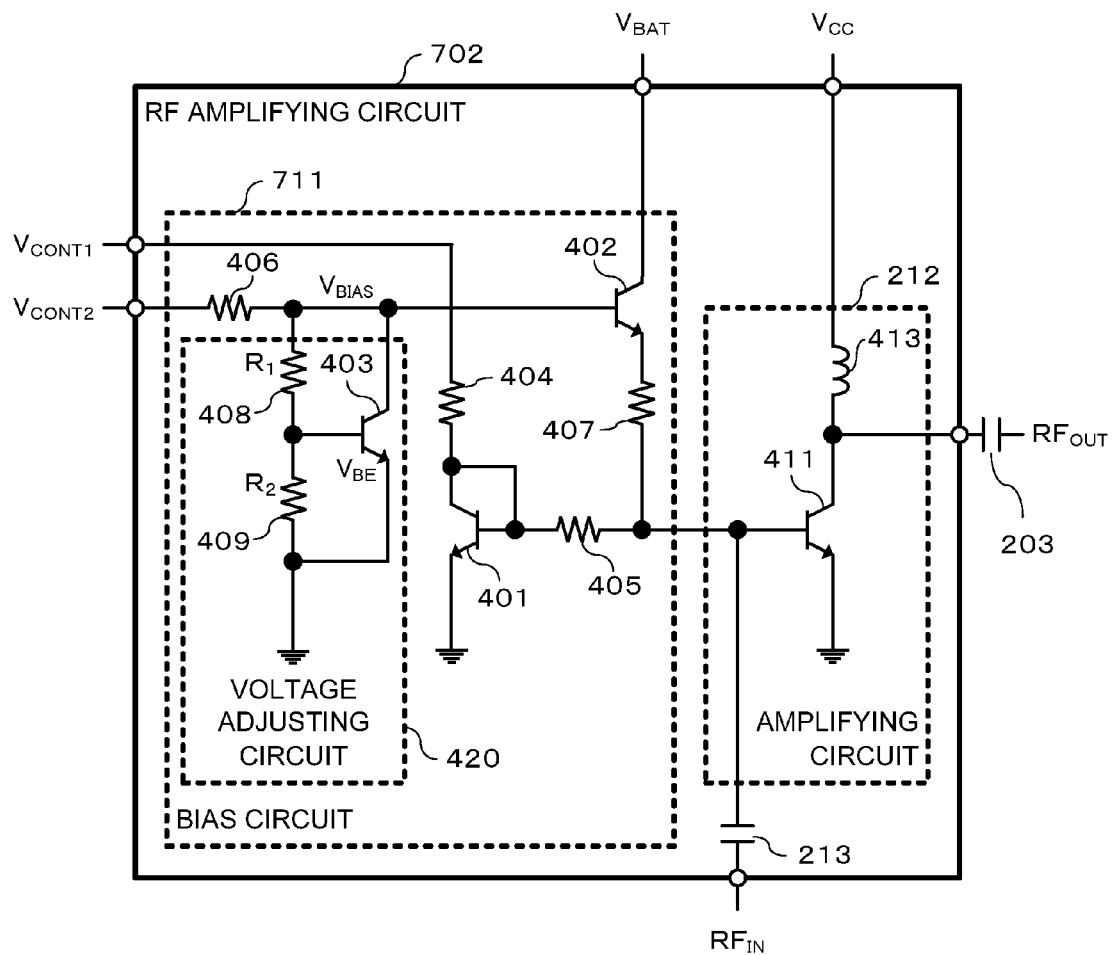
FIG. 9C is a diagram showing further another example of a configuration of the RF amplifying circuit according to a preferred embodiment of the present invention.

FIG. 9A is a diagram showing an example of a configuration of the RF amplifying circuit 702 shown in FIG. 7A. Furthermore, FIG. 9B and FIG. 9C show examples of configurations of the RF amplifying circuit 702 shown in FIG. 7B and FIG. 7C, respectively. The configurations of the RF amplifying circuit 702 in FIG. 9A to FIG. 9C are equivalent except that different power supply voltages are supplied to the respective configurations. Thus, an example of a configuration of the RF amplifying circuit 702 will be described with reference to FIG. 9A. Components of the RF amplifying circuit in FIG. 9A which are equivalent to corresponding components shown in FIG. 4A are denoted by the same reference numerals and will not be described below. As shown in FIG. 9A, the RF amplifying circuit 702 includes the bias circuit 711 instead of the bias circuit 211 in FIG. 4A.

An internal configuration of the bias circuit 711 is equivalent to the internal configuration of the bias circuit 211 shown in FIG. 4A except that different control voltages are externally supplied to the bias circuits 711 and 211, respectively. Specifically, in the bias circuit 711, the control voltage $V_{CONT1}$ is applied to the collector side of the transistor 401, and the control voltage $V_{CONT2}$ is applied to the base side of the transistor 402. Thus, in the bias circuit 711, a bias from the transistor 401 and a bias from the transistor 402 are controlled by the different control voltages. When the two control voltages $V_{CONT1}$ and $V_{CONT2}$ are thus used to control the biases, the linearity of the RF amplifying circuit 702 is significantly improved. This will be described below.

Figure 10:
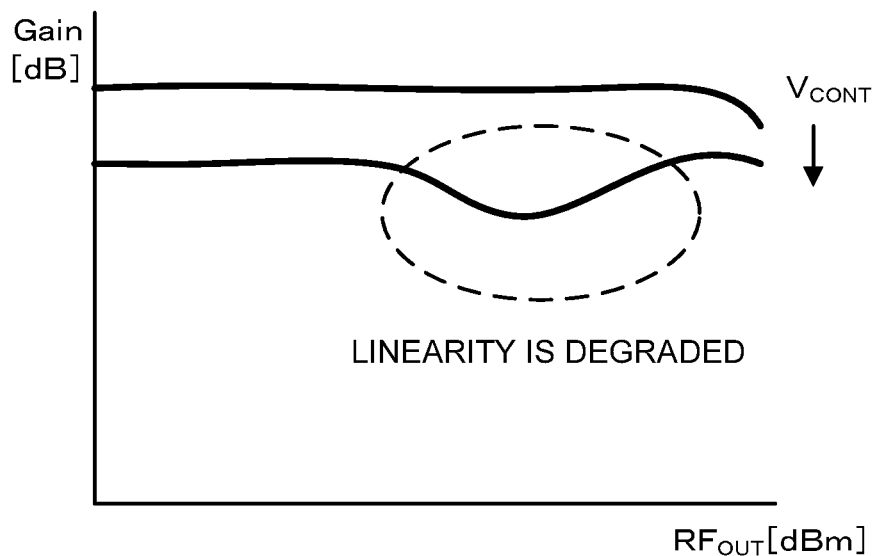
FIG. 10 is a diagram showing an example of a relationship between a control voltage $V_{CONT}$ to and a gain property of the RF amplifying circuit shown in FIG. 4A.

In the RF amplifying circuit, the control voltages may be changed in order to adjust the gain of the RF amplifying circuit. FIG. 10 is a diagram showing a relationship between the control voltage $V_{CONT}$ to and a gain property of the RF amplifying circuit 202 shown in FIG. 4A. As shown in FIG. 10, in the RF amplifying circuit 202, a reduction in control voltage $V_{CONT}$ may degrade the linearity. This is because the RF amplifying circuit 202 uses the single control voltage $V_{CONT}$ to control the bias from the transistor 401 and the bias from the transistor 402. When a base-collector potential of the transistor 401 is reduced in order to lower the gain, the base potential of the transistor 402 simultaneously decreases. In this case, the transistor 402 fails to start operating unless a larger RF signal is input to the RF amplifying circuit. If only the transistor 401 provides a bias, a current flowing through the transistor 411 is limited even with an increase in RF input power, thus reducing the gain of the amplifier. When the transistor 402 fails to start operating before the gain decreases, the linearity decreases as shown in FIG. 10.

Figure 11:
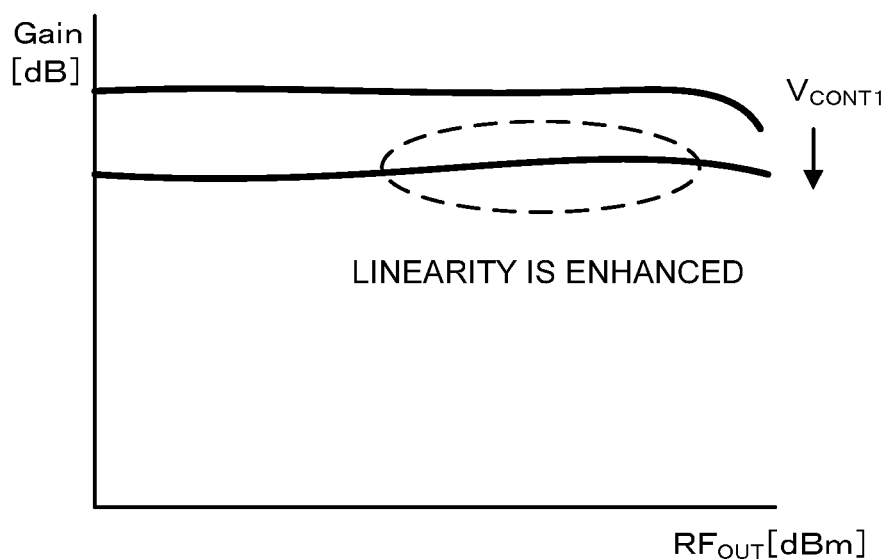
FIG. 11 is a diagram showing an example of a relationship between a control voltage $V_{CONT1}$ to and the gain property of the RF amplifying circuit shown in FIG. 9A.

In order to demonstrate this phenomenon, a relationship between the control voltage $V_{CONT1}$ to and the gain property of the RF amplifying circuit 702 was experimentally checked which relationship was observed when the bias circuit 711 shown in FIG. 9A was adopted. In the experiments, the control voltage $V_{CONT2}$ was maintained at a predetermined level (for example, about 2.35 V) regardless of the control voltage $V_{CONT1}$. FIG. 11 is a diagram showing the results of the experiments. As shown in FIG. 11, when the control voltage $V_{CONT1}$ was reduced with the control voltage $V_{CONT2}$ maintained at the predetermined level, the linearity was successfully improved compared to the linearity in the case shown in FIG. 10.

Figure 12:
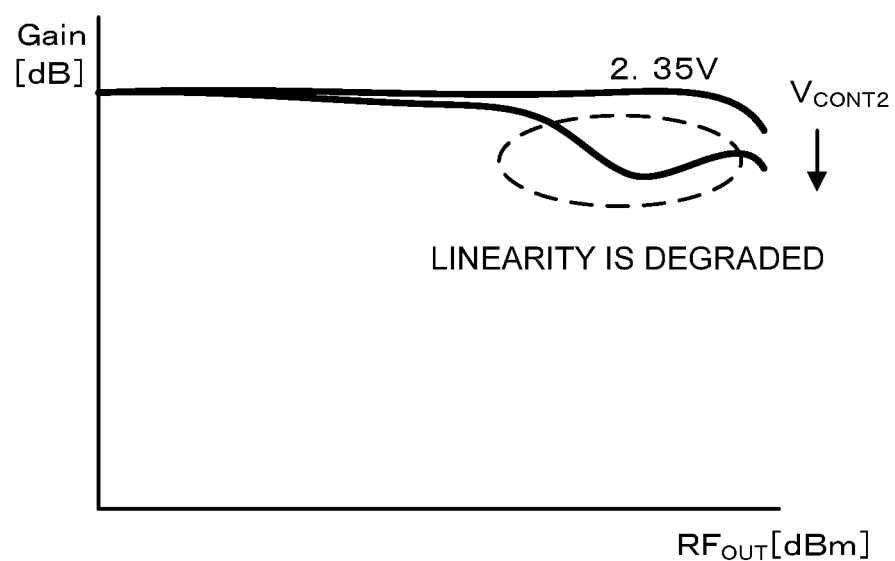
FIG. 12 is a diagram showing an example of a change in gain property observed when a control voltage $V_{CONT2}$ is changed with the control voltage $V_{CONT1}$ maintained at a predetermined level.

Furthermore, FIG. 12 is a diagram showing an example of a change in gain property observed when the control voltage $V_{CONT2}$ is changed, with the control voltage $V_{CONT1}$ maintained at a predetermined level (for example, about 2.35 V) in the RF amplifying circuit 702. FIG. 12 shows that the linearity is degraded by reducing the control voltage $V_{CONT2}$ from, for example, about 2.35 V. This result also indicates that maintaining the control voltage $V_{CONT2}$ at the predetermined level (for example, about 2.35 V) is effective for improving the linearity of the RF amplifying circuit 702.

In the RF amplifying circuit 702, the voltage $V_{BIAS}$ applied to the base of the transistor 402 is determined by the transistor 403 and the resistors 408 and 409. Specifically, when the base-emitter voltage of the transistor 403 is denoted by $V_{BE}$ and the resistance values of the resistors 408 and 409 are denoted by $R_1$ and $R_2$, respectively, the voltage $V_{BIAS}$ applied to the base of the transistor 402 is equal to $V_{BE}(1+(R_1/R_2))$. Thus, when, for example, $V_{BE}$ is about 1.3 V, $V_{BIAS}$ can be set to about 2.35 V by setting the control voltage $V_{CONT2}$ equal to or higher than about 2.35 V and setting $R_1$ and $R_2$ to about 8 kΩ and about 10 kΩ, respectively.

Figure 13A:
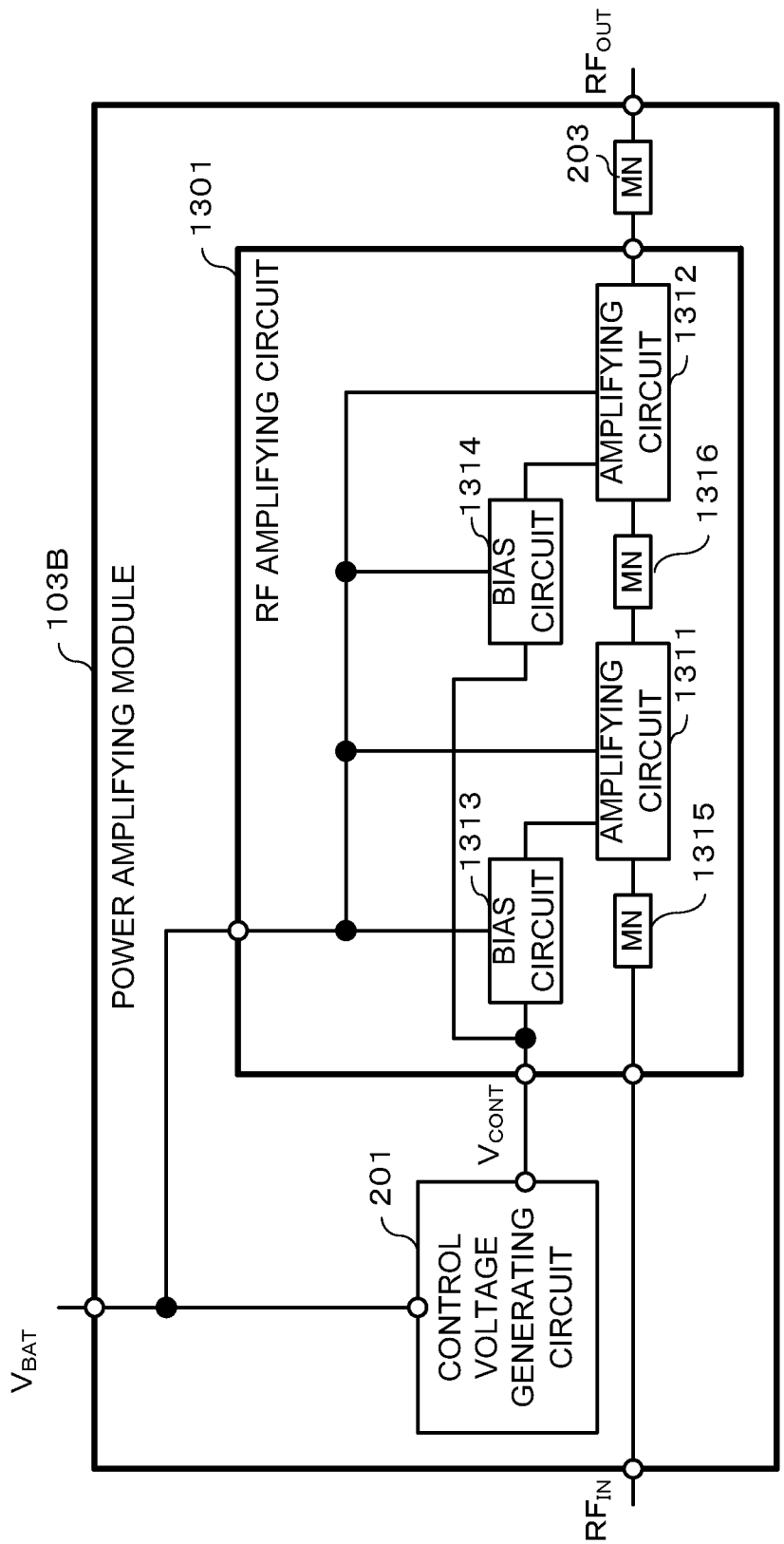
FIG. 13A is a diagram showing further another example of a configuration of the power amplifying module according to a preferred embodiment of the present invention.
Figure 13B:
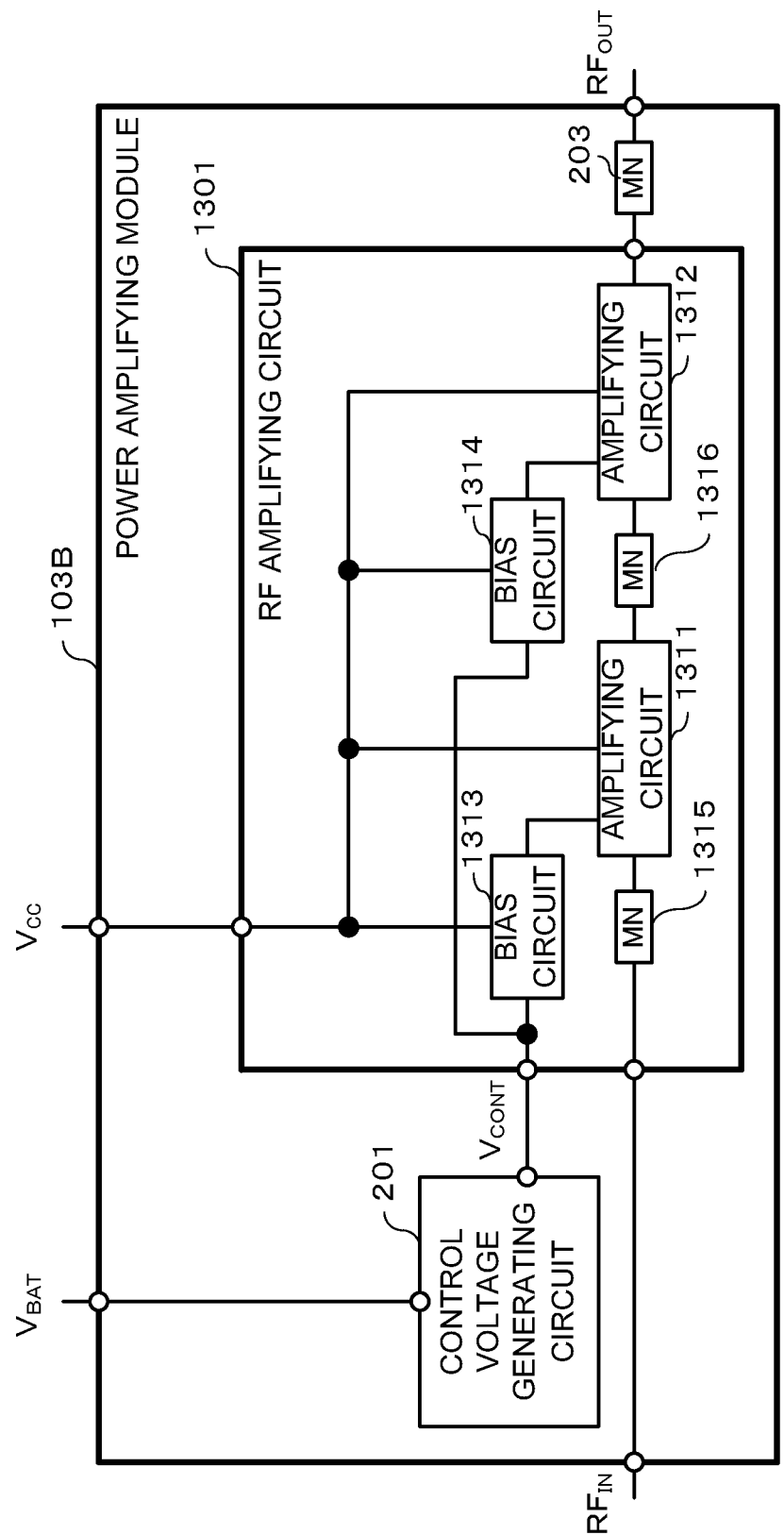
FIG. 13B is a diagram showing further another example of a configuration of the power amplifying module according to a preferred embodiment of the present invention.
Figure 13C:
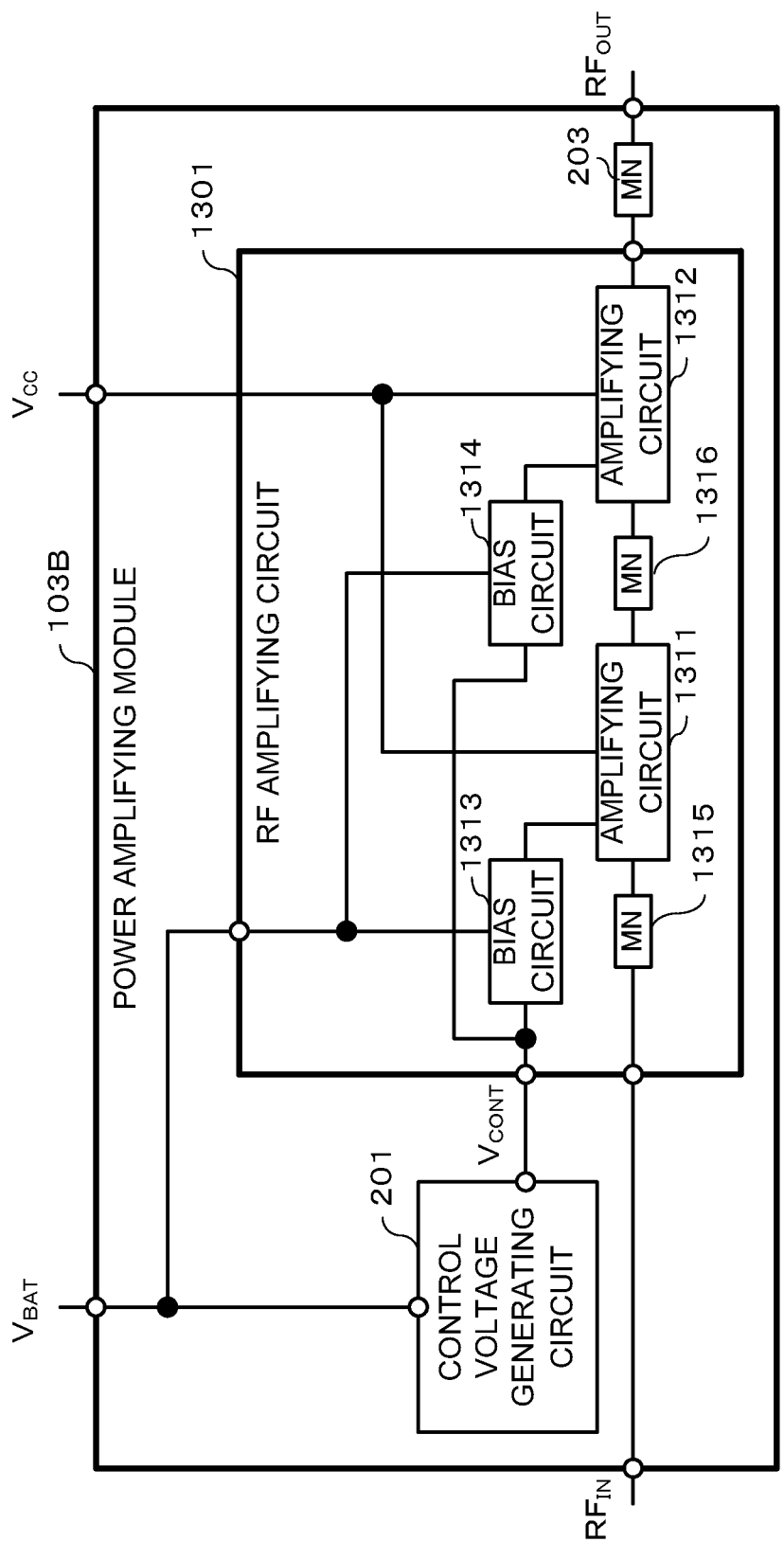
FIG. 13C is a diagram showing further another example of a configuration of the power amplifying module according to a preferred embodiment of the present invention.

FIG. 13A to FIG. 13C are diagrams showing other examples of configurations of the power amplifying module 103. The configurations of the power amplifying module 103 in FIG. 13A to FIG. 13C are equivalent except that different types of power supply voltages are supplied to the respective configurations. Thus, an example of a configuration of the power amplifying module 103 will be described with reference to FIG. 13A. Components of the power amplifying module in FIG. 13A which are equivalent to corresponding components shown in FIG. 2A are denoted by the same reference numerals and will not be described below. As shown in FIG. 13A, a power amplifying module 103B includes the RF amplifying circuit 1301 instead of the RF amplifying circuit 202 in FIG. 2A.

The RF amplifying circuit 1301 includes two amplifying circuits 1311 and 1312. Each of the amplifying circuits 1311 and 1312 is configured equivalently to the amplifying circuit 212 shown in FIG. 4A. Furthermore, the RF amplifying circuit 1301 includes bias circuits 1313 and 1314 for the amplifying circuits 1311 and 1312, respectively. Each of the bias circuits 1313 and 1314 is configured equivalently to the bias circuit 211 shown in FIG. 4A. The bias circuits 1313 and 1314 are supplied with the control voltage $V_{CONT}$. Additionally, the RF amplifying circuit 1301 includes matching networks 1315 and 1316 configured to match an input impedance with an output impedance.

As shown in FIG. 13A, the provision of the two amplifying circuits enables an increase in the gain of the RF amplifying circuit. Even such a configuration allows the bias circuits 1313 and 1314 to operate at al low voltage of, for example, about 2.35 V similarly to the bias circuit 211 shown in FIG. 4A. That is, the RF amplifying circuit 1301 is configured to be driven at a low voltage.

Figure 14A:
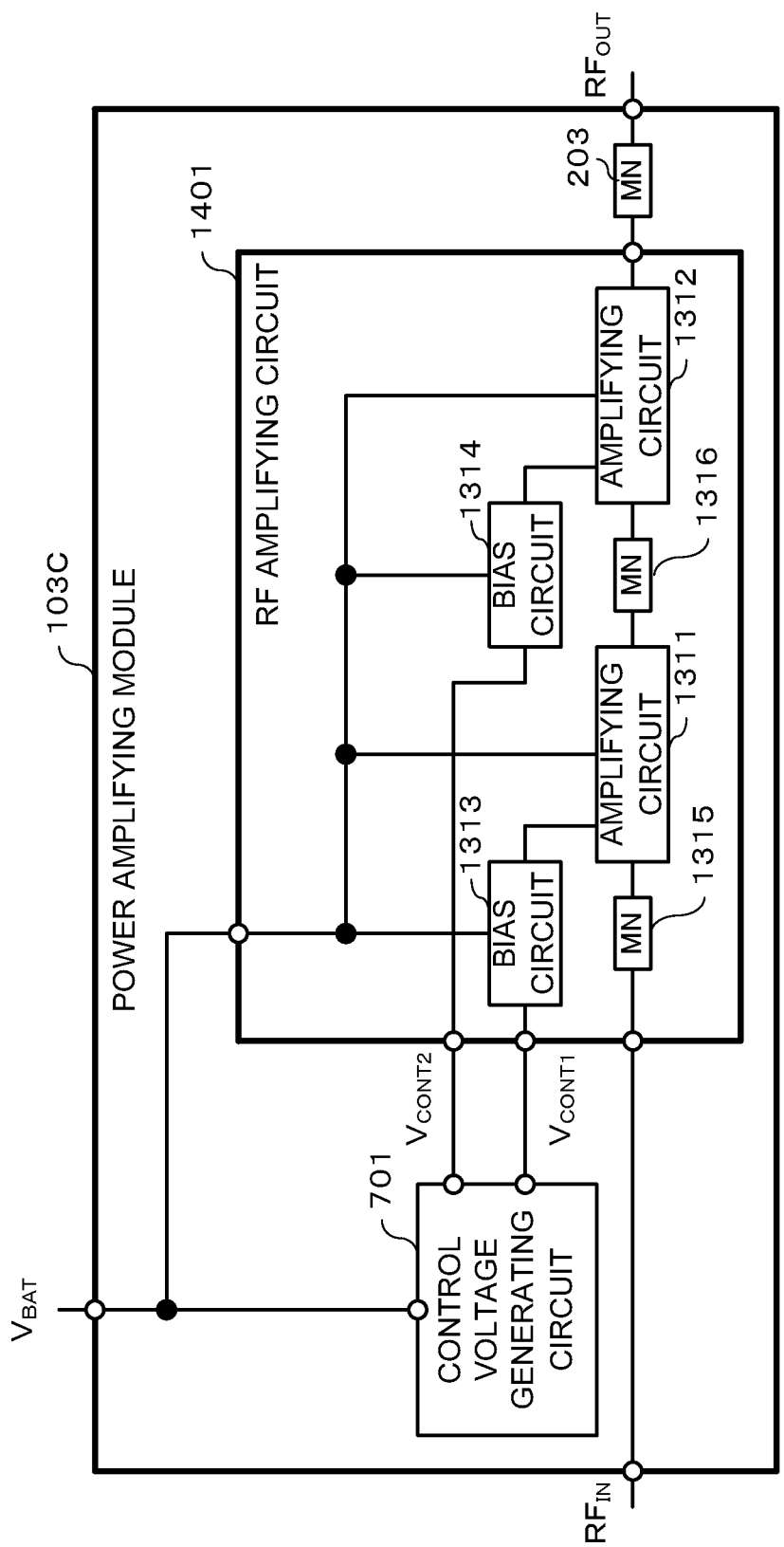
FIG. 14A is a diagram showing further another example of a configuration of the power amplifying module according to a preferred embodiment of the present invention.
Figure 14B:
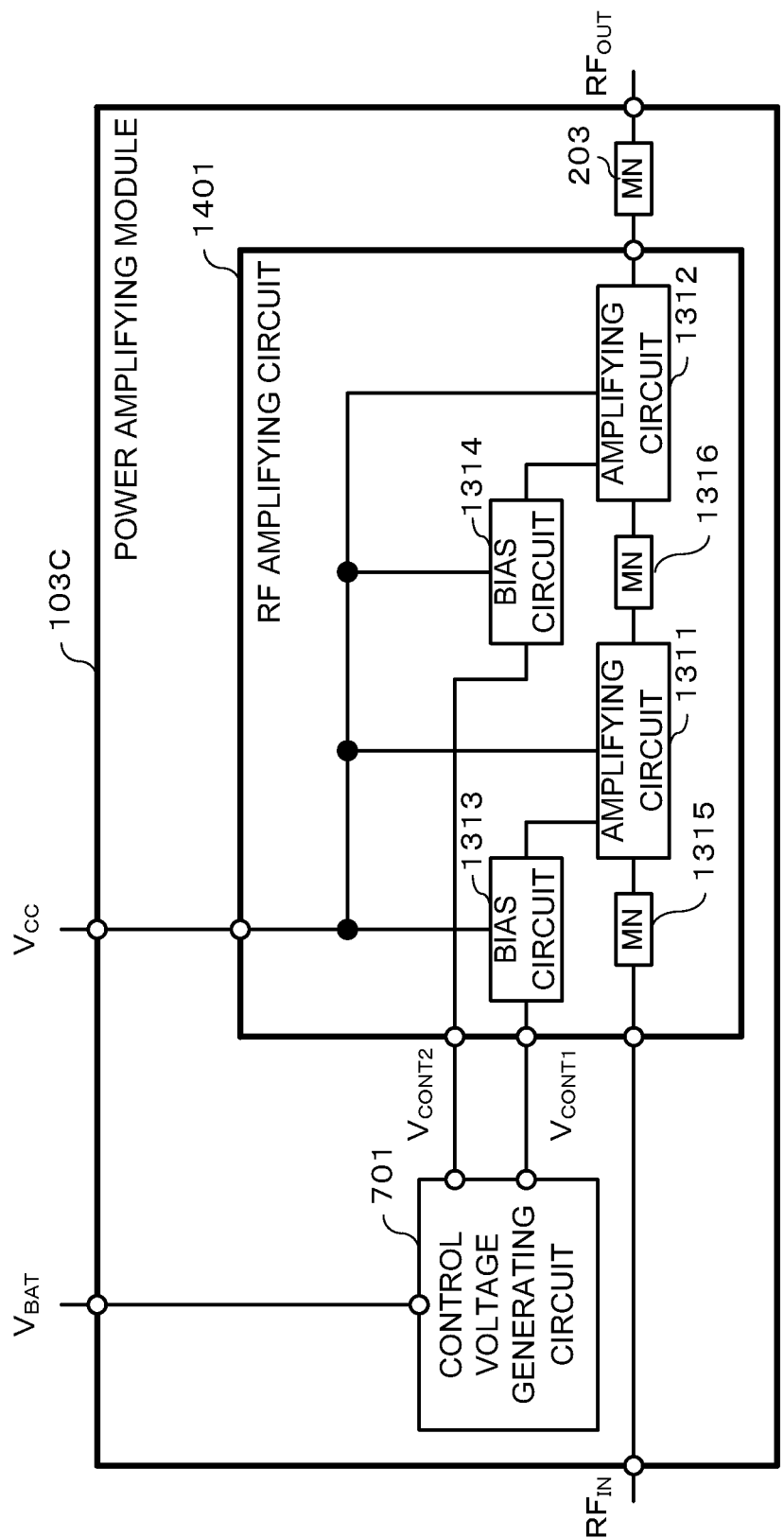
FIG. 14B is a diagram showing further another example of a configuration of the power amplifying module according to a preferred embodiment of the present invention.
Figure 14C:
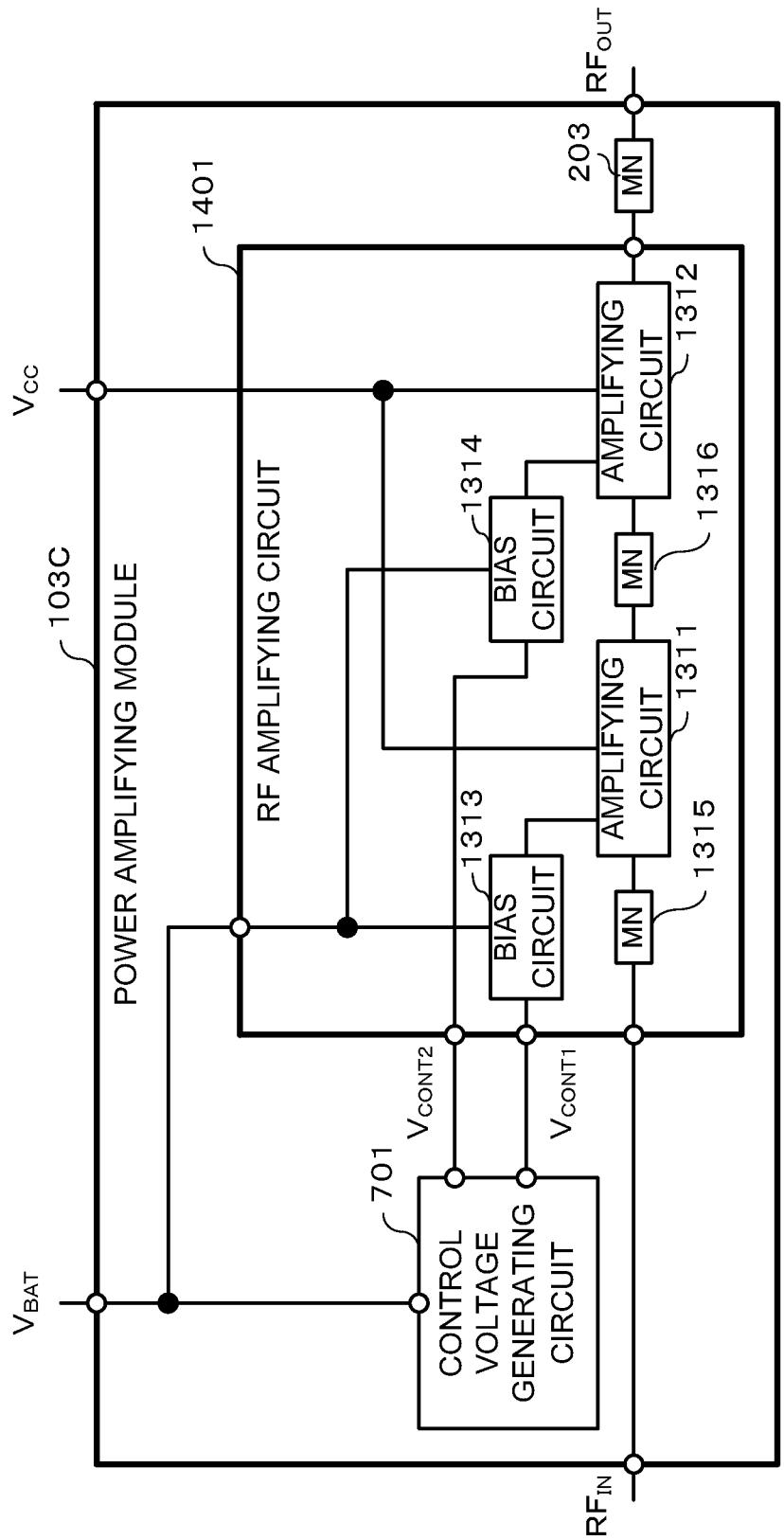
FIG. 14C is a diagram showing further another example of a configuration of the power amplifying module according to a preferred embodiment of the present invention.

FIG. 14A to FIG. 14C are diagrams showing other examples of configurations of the power amplifying module 103. The configurations of the power amplifying module 103 in FIG. 14A to FIG. 14C are equivalent except that different types of power supply voltages are supplied to an RF amplifying circuit 1401. Thus, an example of a configuration of the power amplifying module 103 will be described with reference to FIG. 14A. Components of the power amplifying module in FIG. 14A which are equivalent to corresponding components shown in FIG. 13A are denoted by the same reference numerals and will not be described below. As shown in FIG. 14A, a power amplifying module 103C includes the control voltage generating circuit 701 and the RF amplifying circuit 1401 instead of the control voltage generating circuit 201 and RF amplifying circuit 1301 shown in FIG. 13A. The control voltage generating circuit 701 is configured equivalently to the control voltage generating circuit 701 shown in FIG. 8. The RF amplifying circuit 1401 is configured equivalently to the RF amplifying circuit 1301 shown in FIG. 13A except that the RF amplifying circuit 1401 has input terminals for the control voltages $V_{CONT1}$ and $V_{CONT2}$. In such a configuration, the bias circuits 1313 and 1314 are supplied with the different control voltages $V_{CONT1}$ and $V_{CONT2}$, respectively. This enables bias control in the RF amplifying circuit 1401 to be precisely performed.

Figure 15A:
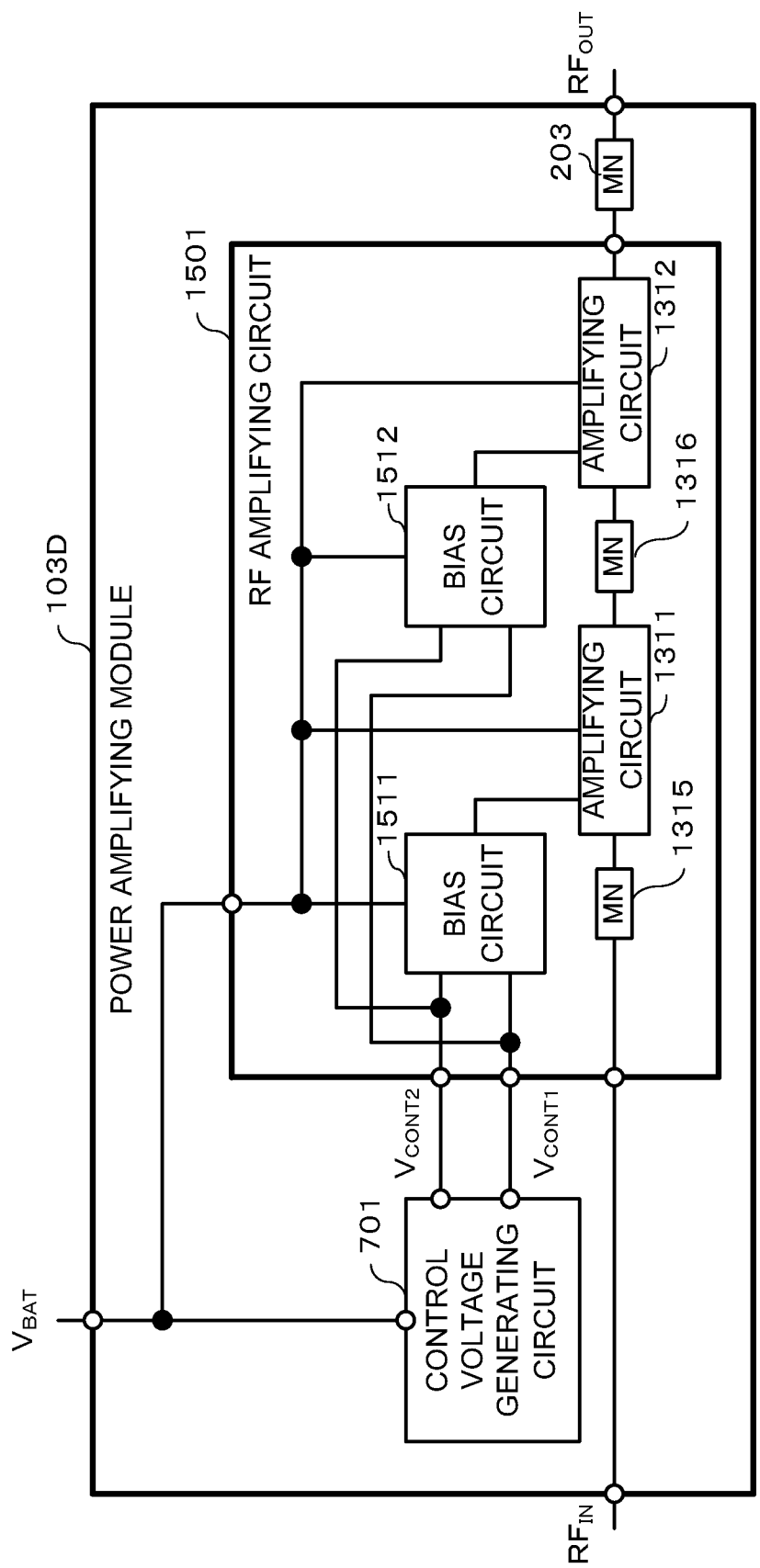
FIG. 15A is a diagram showing further another example of a configuration of the power amplifying module according to a preferred embodiment of the present invention.
Figure 15B:
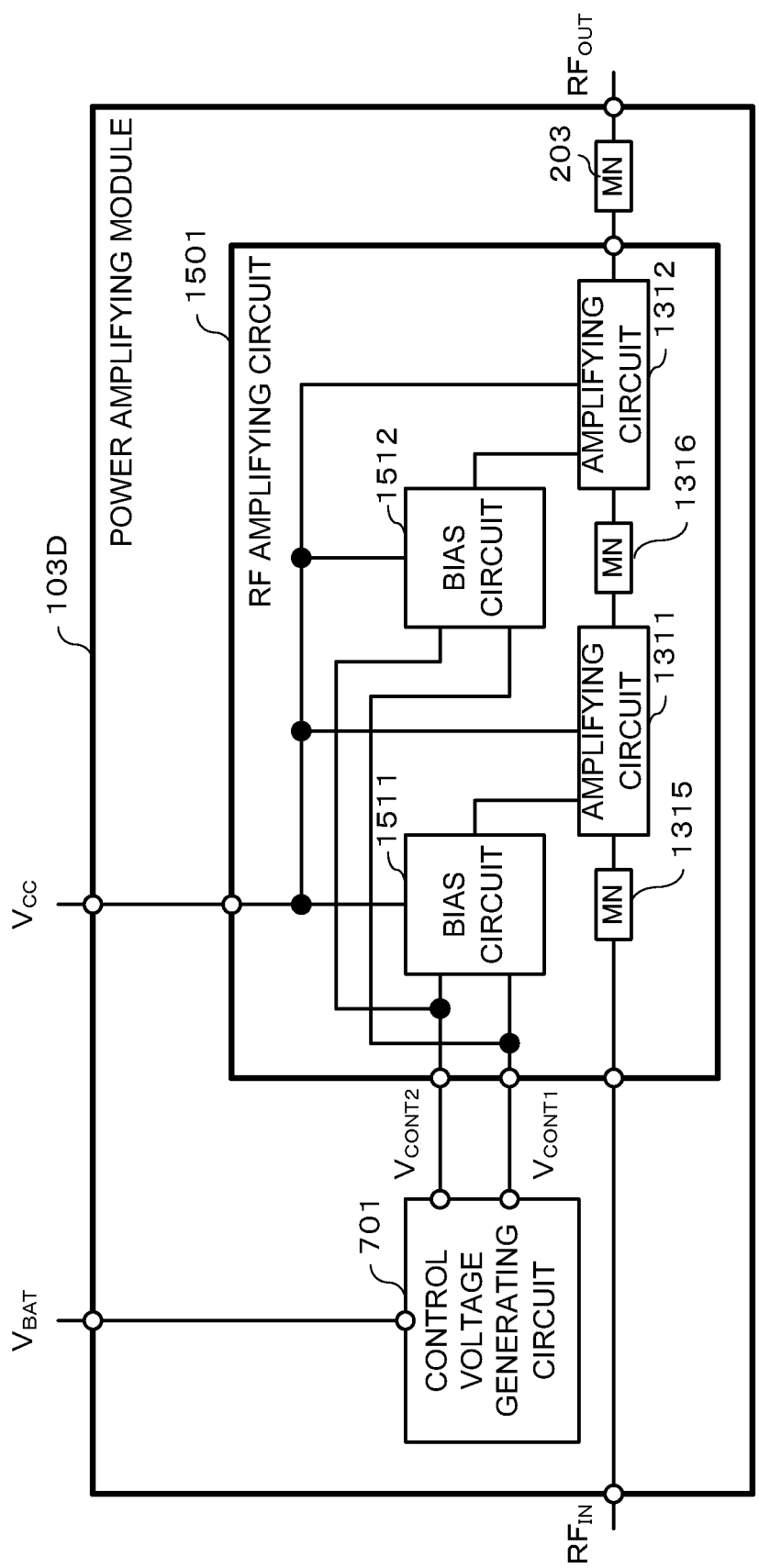
FIG. 15B is a diagram showing further another example of a configuration of the power amplifying module according to a preferred embodiment of the present invention.
Figure 15C:
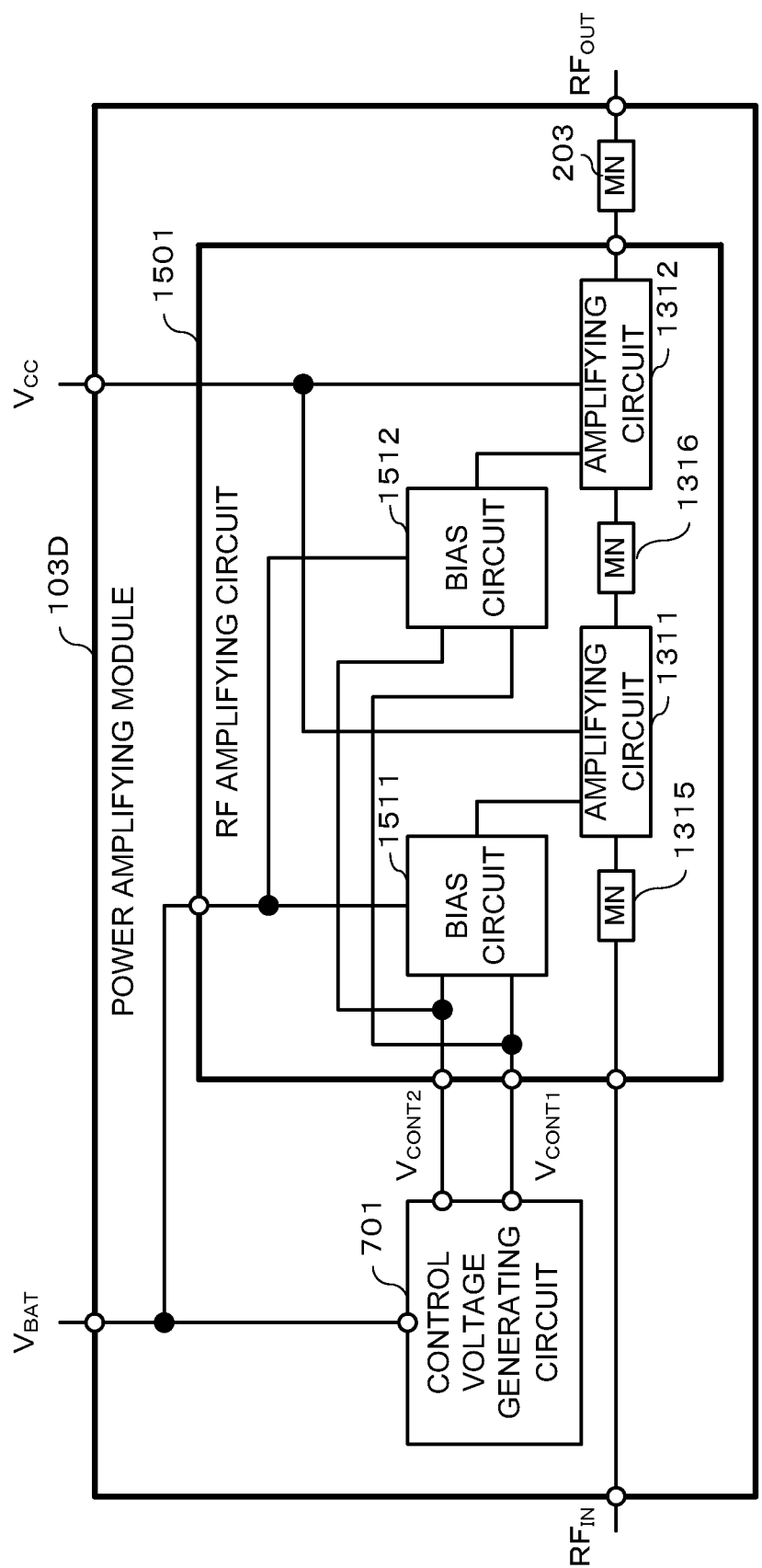
FIG. 15C is a diagram showing further another example of a configuration of the power amplifying module according to a preferred embodiment of the present invention.
Figure 16:
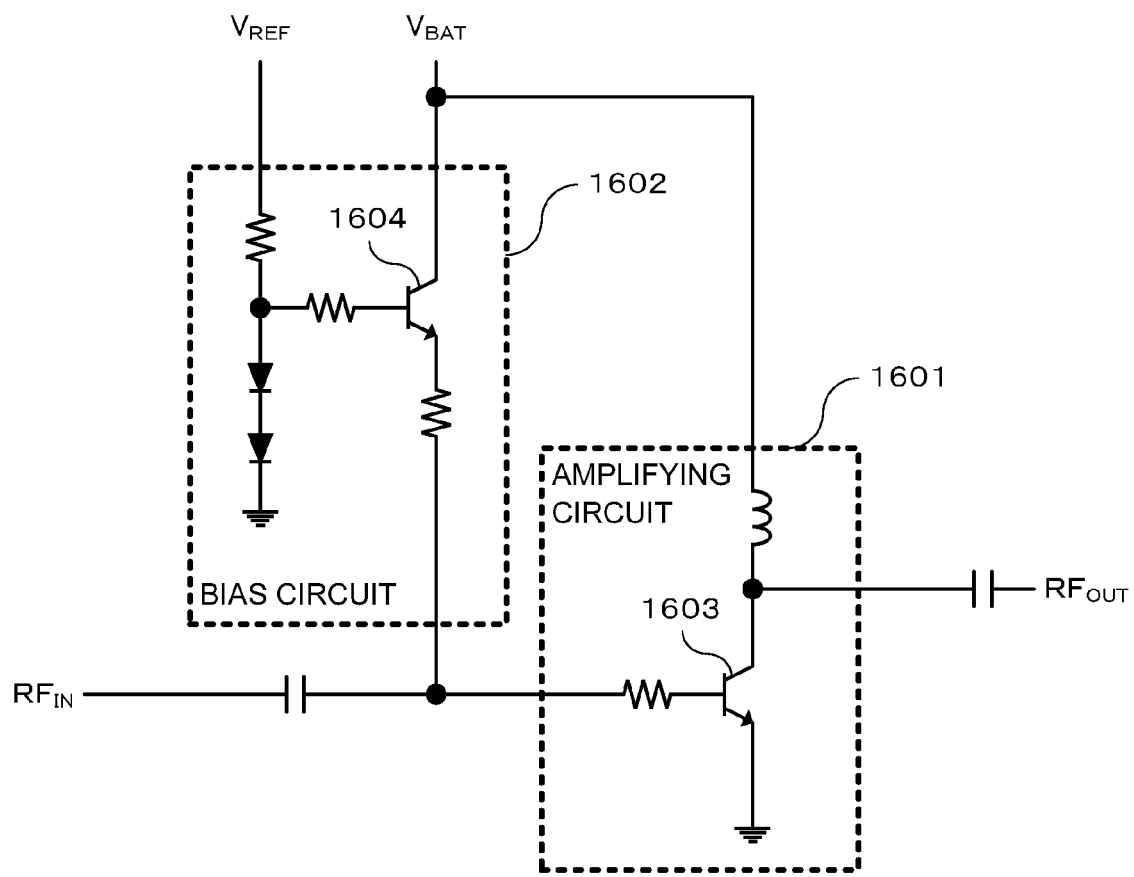
FIG. 16 is a diagram showing a common configuration of an amplifying circuit and a bias circuit.

FIG. 15A to FIG. 15C are diagrams showing other examples of configurations of the power amplifying module 103. The configurations of the power amplifying module 103 in FIG. 15A to FIG. 15C are equivalent except that different types of power supply voltages are supplied to an RF amplifying circuit 1501. Thus, an example of a configuration of the power amplifying module 103 will be described with reference to FIG. 15A. Components of the power amplifying module in FIG. 15A which are equivalent to corresponding components shown in FIG. 14A are denoted by the same reference numerals and will not be described below. As shown in FIG. 15A, a power amplifying module 103D includes the RF amplifying circuit 1501 instead of the RF amplifying circuit 1401 shown in FIG. 14A.

The RF amplifying circuit 1501 includes bias circuits 1511 and 1512 instead of the bias circuits 1313 and 1314 in the RF amplifying circuit 1401 shown in FIG. 14A. Each of the bias circuits 1511 and 1512 is configured equivalently to the bias circuit 711 shown in FIG. 9A. The bias circuits 1511 and 1512 are supplied with the control voltages $V_{CONT1}$ and $V_{CONT2}$. Even when two amplifying circuits are provided as described above, effects similar to the effects of the circuit configuration shown in FIG. 9A by preparing two control voltages supplied to each of the two bias circuits. The power amplifying module may be configured such that the control voltages $V_{CONT1}$ and $V_{CONT2}$ supplied to the bias circuit 1511 are controlled separately from the control voltages $V_{CONT1}$ and $V_{CONT2}$ supplied to the bias circuit 1512.

Figure 17:
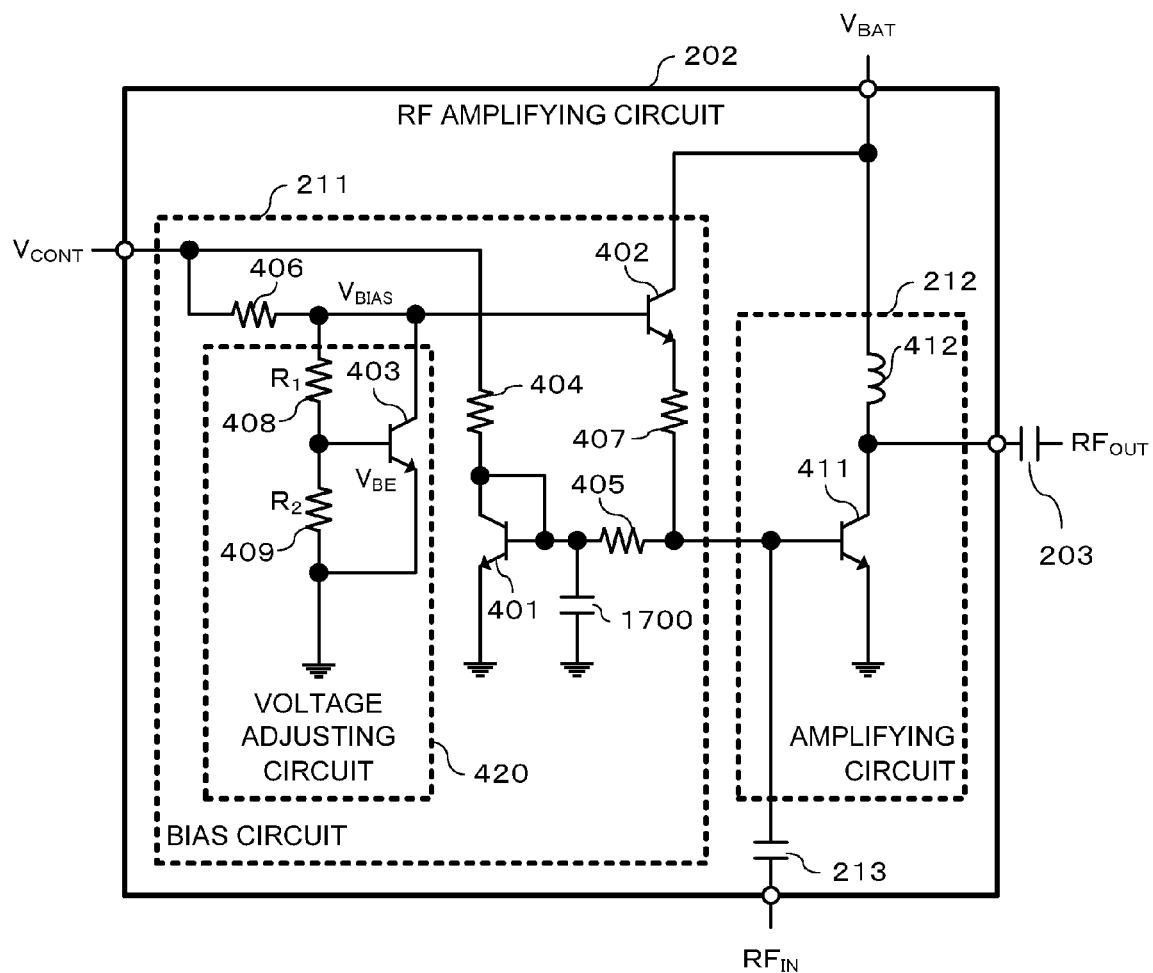
FIG. 17 is a diagram showing a variation of the RF amplifying circuit shown in FIG. 4A.

FIG. 17 is a diagram showing a variation of the RF amplifying circuit 202 shown in FIG. 4A. Components of this circuit in FIG. 17, which are equivalent to corresponding components shown in FIG. 4A, are denoted by the same reference numerals as those in FIG. 4A and explanation thereof is omitted below. As shown in FIG. 17, the RF amplifying circuit 202 includes a capacitor 1700 in addition to the components shown in FIG. 4. The capacitor 1700 is connected to the base of the transistor 401 at one end of the capacitor 1700 and grounded at the other end of the capacitor 1700. Providing the capacitor 1700 in this manner allows the linearity of the RF amplifying circuit 202 to be improved. This will be described below.

Figure 18:
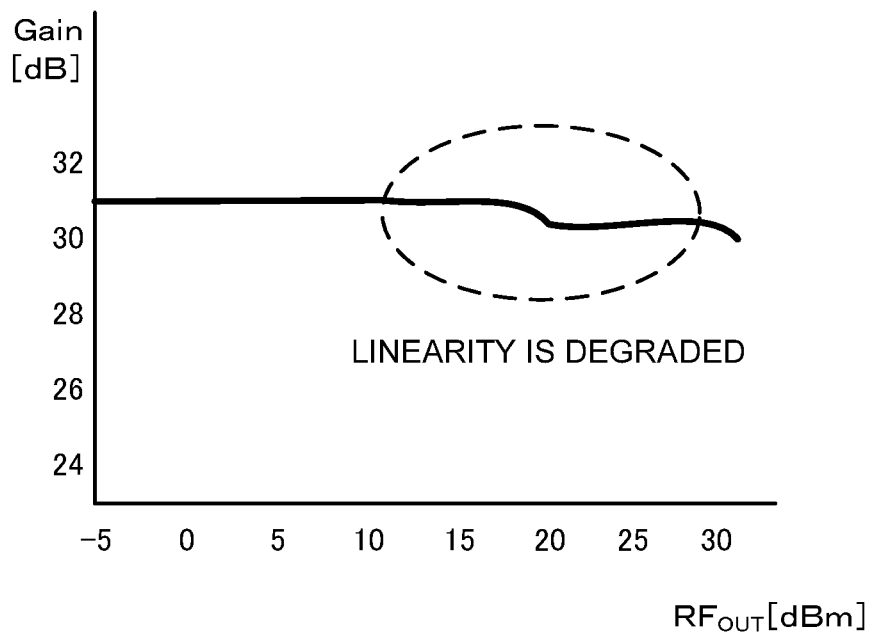
FIG. 18 is a diagram of simulation results indicating an example of a relationship between an amplified signal $RF_{OUT}$ from and a gain of the configuration shown in FIG. 4A.

FIG. 18 is a diagram of simulation results showing an example of a relation between the amplified signal $RF_{OUT}$ from and the gain of the configuration shown in FIG. 4A (the configuration without the capacitor 1700). As shown in FIG. 18, the gain slightly decreases in a region where the amplified signal $RF_{OUT}$ is at a medium signal level (in FIG. 18, nearly 20 dBm).

As described above, in the RF amplifying circuit 202 shown in FIG. 4A, a bias is supplied by the transistor 401 connected to the transistor 411 on the basis of a current-mirror connection in a region where the RF signal ($RF_{IN}$) is at a low signal level (that is, the region where the amplified signal ($RF_{OUT}$) is at a low signal level). Furthermore, in a region where the RF signal ($RF_{IN}$) is at a high signal level (that is, the region where the amplified signal ($RF_{OUT}$) is at a high signal level), in addition to the bias based on the current mirror, a bias is supplied by the transistor 402 connected to the transistor 411 on the basis of an emitter-follower connection. The decrease in gain shown in FIG. 18 is expected to be due to a temporary insufficiency of bias, for example, at a timing when the supply of the bias based on the emitter follower is started.

Figure 19:
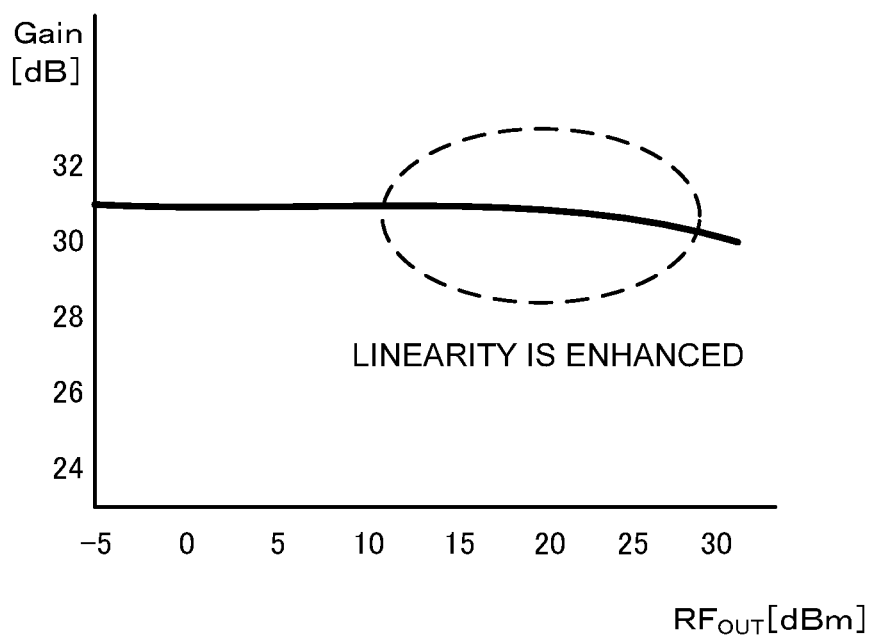
FIG. 19 is a diagram of simulation results indicating an example of a relationship between the amplified signal $RF_{OUT}$ from and the gain of the configuration shown in FIG. 17.

FIG. 19 is a diagram of simulation results showing an example of a relationship between the amplified signal $RF_{OUT}$ from and the gain of the configuration shown in FIG. 17 (the configuration with the capacitor 1700). In the RF amplifying circuit 202 shown in FIG. 17, charge is accumulated in the capacitor 1700 while the bias based on the current mirror is being supplied. The charge accumulated in the capacitor 1700 is supplied to the base of the transistor 411 to compensate for the insufficiency of bias. Thus, as shown in FIG. 19, the decrease in gain observed in FIG. 18 is reversed, allowing the linearity of the RF amplifying circuit 202 to be improved.

In the described configuration, the capacitor 1700 is added to the RF amplifying circuit 202 shown in FIG. 4A. Similarly, when the capacitor 1700 is added to the RF amplifying circuit 202 shown in FIG. 4B and FIG. 4C, the linearity is improved. This also applies to the RF amplifying circuit 202 with a multistage configuration.

Various preferred embodiments of the present invention have been described. Even when the control voltage $V_{CONT}$ is a low voltage of about 2.35 V, various preferred embodiments of the present invention work as follows. In a region where the RF signal ($RF_{IN}$) is at a low level, a bias is supplied by the bias transistor connected to the amplifying transistor on the basis of a current-mirror connection. In a region where the RF signal ($RF_{IN}$) is at a high level, a bias is supplied by the bias transistor connected to the amplifying transistor on the basis of an emitter-follower connection. That is, the RF amplifying circuit is configured to be driven at a low voltage.

Various preferred embodiments of the present invention also individually control the control voltage supplied to the bias transistor connected to the amplifying transistor on the basis of the current-mirror connection and the control voltage supplied to the bias transistor connected to the amplifying transistor in an emitter follower transistor. Thus, the gain of the RF amplifying circuit is adjustable simply by changing only the control voltage supplied to the bias transistor connected to the amplifying transistor on the basis of the current-mirror connection while the control voltage supplied to the bias transistor connected to the amplifying transistor in an emitter follower transistor is maintained at a predetermined level. When the control voltage supplied to the bias transistor connected to the amplifying transistor in an emitter follower transistor is thus maintained at the predetermined level, the linearity of the RF amplifying circuit is significantly improved.

The same control voltage may be supplied both to the bias transistor connected to the amplifying transistor on the basis of the current-mirror connection and to the bias transistor connected to the amplifying transistor on the basis of the emitter-follower connection. This allows a single terminal to be used to supply the control voltage, enabling a reduction in chip size.

Furthermore, various present preferred embodiments of the present invention allow the control voltage supplied to the bias transistor connected to the amplifying transistor on the basis of the emitter-follower connection to be adjusted according to the temperature property of the bias transistor. This enables the bias supplied to the amplifying transistor by the bias transistor to be prevented from varying depending on temperature, allowing the linearity of the RF amplifying circuit to be improved.

Additionally, various preferred embodiments of the present invention achieve the above-described effects and advantages even when two amplifying circuits are provided. This also applies to provision of three or more amplifying circuits.

In addition, various preferred embodiments of the present invention provide a capacitor connected at one end thereof to the bias transistor connected to the amplifying transistor on the basis of a current-mirror connection and grounded at the other end thereof. This enables a possible insufficiency of bias to be compensated for, allowing the linearity of the RF amplifying circuit to be improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio frequency amplifying circuit comprising:
   an amplifying transistor configured to amplify a radio frequency signal input to a base of the amplifying transistor via a matching network to output an amplified radio frequency signal;
   a first bias transistor connected to the amplifying transistor based on a current-mirror connection to supply a bias to the amplifying transistor; and
   a second bias transistor connected to the base of the amplifying transistor based on an emitter-follower connection to supply a bias to the amplifying transistor,
   wherein a first control voltage applied to a collector side of the first bias transistor and a second control voltage applied to a base side of the second bias transistor are controlled independently from each other.

2. The radio frequency amplifying circuit according to claim 1, further comprising a voltage adjusting circuit configured to adjust the voltage applied to the base of the second bias transistor according to a temperature property of the second bias transistor.

3. The radio frequency amplifying circuit according to claim 2, wherein the voltage adjusting circuit includes a voltage adjusting transistor having a temperature property of a base-emitter voltage that is equivalent to a temperature property of a base-emitter voltage of the second bias transistor, and is configured to supply a voltage in accordance with the base-emitter voltage of the voltage adjusting transistor to the base of the second bias transistor.

4. The radio frequency amplifying circuit according to claim 1, further comprising a capacitor connected to a base of the first bias transistor at one end of the capacitor and grounded at another end of the capacitor.

5. The radio frequency amplifying circuit according to claim 1, further comprising:
   a second amplifying transistor configured to amplify a radio frequency signal input, by the amplifying transistor, to a base of the second amplifying transistor via a matching network;
   a third bias transistor connected to the second amplifying transistor based on a current-mirror connection to supply a bias to the second amplifying transistor; and
   a fourth bias transistor connected to a base of the second amplifying transistor based on an emitter-follower connection to supply a bias to the second amplifying transistor.

6. The radio frequency amplifying circuit according to claim 5, wherein an input terminal for a first control voltage applied to collector sides of the first and third bias transistors and an input terminal for a second control voltage applied to base sides of the second and fourth bias transistors are independent and separate from each other.

7. The radio frequency amplifying circuit according to claim 5, wherein an input terminal for a first control voltage applied to collector sides of the first and third bias transistors and an input terminal for a second control voltage applied to base sides of the second and fourth bias transistors are defined by a common terminal.

8. The radio frequency amplifying circuit according to claim 5, further comprising a voltage adjusting circuit configured to adjust the voltage applied to the bases of the second and fourth bias transistors according to temperature properties of the transistors.

9. The radio frequency amplifying circuit according to claim 5, further comprising:
   a first capacitor connected to a base of the first bias transistor at one end of the first capacitor and grounded at another end of the first capacitor; and
   a second capacitor connected to a base of the third bias transistor at one end of the second capacitor and grounded at another end of the second capacitor.

10. The radio frequency amplifying circuit according to claim 1, wherein at least one of the amplifying transistor, the first bias transistor, and the second bias transistor is a heterojunction bipolar transistor.

11. A power amplifying module comprising:
    the radio frequency amplifying circuit according to claim 1; and
    a control voltage generating circuit configured to generate a control voltage supplied to the radio frequency amplifying circuit.

12. The radio frequency amplifying circuit according to claim 2, further comprising a capacitor connected to a base of the first bias transistor at one end of the capacitor and grounded at another end of the capacitor.

* * * * *